(12) United States Patent
Hosoda

(10) Patent No.: US 6,424,587 B1
(45) Date of Patent: Jul. 23, 2002

(54) SEMICONDUCTOR MEMORY DEVICE THAT IS TESTED EVEN WITH FEWER TEST PINS

(75) Inventor: Masahiro Hosoda, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/774,801

(22) Filed: Feb. 1, 2001

(30) Foreign Application Priority Data

Aug. 10, 2000 (JP) ........................................ 2000-242148

(51) Int. Cl.[7] .................................................. G11C 8/00
(52) U.S. Cl. ................. 365/230.03; 365/63; 365/230.06
(58) Field of Search ............................ 365/230.03, 63, 365/189.01, 189.03, 230.06, 201

(56) References Cited

U.S. PATENT DOCUMENTS 5,880,996 A * 3/1999 Roohparvar ............ 365/185.33
6,105,105 A * 8/2000 Trimberger ................. 711/103
6,157,567 A * 12/2000 Kuo et al. ............... 365/185.04

FOREIGN PATENT DOCUMENTS

JP    11-149798    6/1999

* cited by examiner

*Primary Examiner*—Son T. Dinh
(74) *Attorney, Agent, or Firm*—McDermott, Will & Emery

(57) ABSTRACT

A semiconductor memory device includes an inner circuit. The inner circuit includes a command user interface, a logical circuit and a pad. Based upon an externally input fixing command, the command user interface outputs signals A and B with H or L level. Upon receipt of the signal A of H level and the signal B of L level, the logical circuit outputs a fixed logical signal of H level independent of the signal received from the pad, and upon receipt of the signal A of L level and the signal B of H level, outputs a fixed logical signal of L level independent of the signal received from the pad. Thus, it becomes possible to carry out a high-quality testing operation even when the number of the test pins of a test device is smaller than the number of address pins or data pins of a semiconductor memory device.

11 Claims, 13 Drawing Sheets

SEMICONDUCTOR MEMORY DEVICE THAT IS TESTED EVEN WITH FEWER TEST PINS

BACKGROUND OF THE INVENTION

1. Field of the Invention

The present invention relates to a semiconductor memory device, and more specifically concerns a semiconductor memory device which is subjected to a high-quality testing operation even when the number of the test pins of a test device is smaller than the number of address pins or data pins of the semiconductor memory device.

2. Description of the Background Art

Upon carrying out a test on a semiconductor memory device, a test device is connected to the semiconductor memory device and data wiite and data read operations are executed. Then, depending on whether or not the readout data is coincident with the write data, a judgment is made as to whether or not the semiconductor memory device is flawless.

In the data writing and data reading operations at the time of this test, address signals are also externally input to the semiconductor memory device in the same manner as a normal operation, and word lines and paired bit lines to be activated are selectively specified by the address signals. Then, the data writing and data reading operations are executed in and from memory cells connected to the activated word lines and paired bit lines.

Therefore, in the conventional semiconductor memory device, the test has been carried out with the number of address pins being coincident with the number of test pins of the test device.

However, the semiconductor memory device tends to have an increase in the number of pins as it comes to have a higher capacity. For example, following a semiconductor memory device having a total number of 48 pins including 20 address pins, a semiconductor memory device having a total number of 52 pins including 21 address pins has been developed. Therefore, the test device has only 20 test pins to be connected to the address pins of a semiconductor memory device, and even when this is connected to the newly developed semiconductor memory device with 21 address pins, it fails to input address signals to the semiconductor memory device, resulting in a failure in carrying out the test on the semiconductor memory device connected thereto.

Moreover, this problem alises not only in address pins, but also in data pins for executing data input and output.

SUMMARY OF THE INVENTION

Therefore, the objective of the present invention is to provide a semiconductor memory device which can be subjected to a high-quality testing operation even when the number of the test pins of a test device is smaller than the number of address pins or data pins of the semiconductor memory device.

A semiconductor memory device in accordance with the present invention is provided with: n (natural number) number of input/output terminals for inputting n number of address signals; a command terminal for inputting a fixing command to fix the address signals to a first or second logic; a plurality of memory cells; a plurality of bit lines placed in correspondence with the plurality of memory cells; a plurality of word lines placed in correspondence with the plurality of memory cells; an inner circuit receiving m number of address signals through m (m: a natural number satisfying n–>1) number of input/output terminals among n number of input/output terminals upon entering a test mode, and based upon the fixing command, generating n–m number of first logical signals in which each of n–m number of address signals is fixed to a first logic or n m number of second logical signals in which each of n–m number of address signals is fixed to a second logic so as to output n number of inner address signals including the m number of address signals and the n–m number of first or second logical signals; and a row/column decoder decoding the address signals so as to activate the plurality of bit lines or the plurality of word lines based upon the n number of inner address signals.

In the semiconductor memory device of the present invention, following a shift to a test mode, a fixing command is input thereto, and operation are input thereto. Then, the inner circuit generates a first logical signal to fix un-input address signals to the first logic or a second logical signal to fix them to the second logic, and outputs the resulting signal to the row/column decoder together with the input address signals. In other words, the inner circuit generates the first or second logical signal fixed to the first or second logic in place of each of the un-input address signals so that it virtually generates each of the un-input address signals, and outputs the resulting signal to the row/column decoder. Based upon the input address signals and the first or second logical signal, the row/column decoder decodes row addresses or column addresses for selecting word lines or bit lines through which data is input and output to and from a plurality of memory cells.

Therefore, in accordance with the present invention, even when address signals the number of which is smaller than that in the normal operation are input thereto, it is possible to carry out the test on all the memory cells. As a result, even when the input/output lines of the test device are fewer than the address pins of the semiconductor memory device, it is possible to carry out a data input/output test on all the memory cells.

More preferably, based upon the fixing command, the inner circuit of the semiconductor memory device generates n–m number of the first or second logical signals with respect to n–m number of high order address signals among n number of address signals.

Among the n number of address signals, m number of address signals that are low order address signals are input to the semiconductor memory device. Then, the inner circuit generates the first or second logical signals with respect to the n–m number of the un-input high order address signals, and outputs virtually the same number of address signals as that of the normal operation to the row/column decoder, thereby making it possible to carry out the test.

Therefore, in accordance with the present invention, even when the number of address pins increases as a semiconductor memory device comes to have a higher capacity, the semiconductor memory device can be subjected to a testing operation by using the same number of address pins subjected to a testing operation by using the same number of address pins as that of conventional address pins.

More preferably, the inner circuit of the semiconductor memory device includes an interface circuit generating n–m number of pairs of third and fourth logical signals, based upon the fixing command and n–m number of logical circuits receiving a pair of the third and fourth logical signals, generating the first logical signal when the third logical signal has the first logic and the fourth logical signal has the second logic, and generating the second logical signal when the third logical signal has the second logic and the fourth logical signal has the first logic.

Upon receipt of a fixing command, the interface circuit generates the third and fourth logical signals as paired logical signals. Then, the logical circuit generates the first or second logical signal when either of the third and fourth logical signal has the first logic. Therefore, in accordance with the present invention, by receiving the fixing command, it becomes possible to virtually generate address signals without being input.

More preferably, each of the n-m number of logical circuits in the inner circuit includes a pad for receiving any one of address signals among n-m number of address signals, and outputs, as it is, the one of the address signals when the third and fourth logical signals have the second logic and one of the address signals is input through the pad.

When the input/output lines of the test device increases resulting in an increase in the address signals input from the test device, the inner circuit outputs the address signals that can be newly input, as they are, without generating the first or second logical signal to fix the address signals to the first or second logic. Therefore, in accordance with the present invention, testing operations having the same quality can be carried out by using a plurality of test devices having input/output lines the numbers of which are different from each other.

Moreover, the semiconductor memory device in accordance with of the present invention is operated by a first word configuration or a second word configuration different from the first word configuration and, comprises of: an input/output terminal for receiving a fixing command, a circuit generating a first word configuration switching signal for switching the word configuration thereof to the first word configuration and a second word configuration switching signal for switching the word configuration based upon the fixing command thereof to the second word configuration; and an input/output circuit switching the word configuration to the first or second word configuration based upon the first or second word configuration switching signal, and inputting and outputting data to and from the plurality of memory cells.

In the semiconductor memory device in accordance with the present invention, upon receipt of a fixing command, the word configuration switching signal generation circuit generates a first word configuration switching signal for making a switchover to the first word configuration or a second word configuration switching signal for making a switchover to the second word configuration. In other words, the first and second word configuration switching signals for switching the word configurations are generated inside the semiconductor memory device without externally receiving a command for switching the word configurations. Then, based upon the first or second word configuration switching signal thus generated, the input/output circuits switches the word configurations, and inputs and outputs the resulting data in and from the plurality of memory cells.

Therefore, in accordance with the present invention, the word configuration of the semiconductor memory device can be switched without providing an input/output terminal required for a command for switching the word configurations. Moreover, by receiving a fixing command for providing a smaller word configuration to the semiconductor memory device in a test mode, it is possible to carry out the test by using input/output terminals the number of which is smaller than that of the normal operation.

More preferably, the word configuration switching signal generation circuit of the semiconductor memory device includes an interface circuit for generating the first and second logical signals based upon the fixing command, and a logical circuit generating the first word configuration switching signal when the first logical signal has the first logic and the second logical signal has the second logic, generating the second word configuration switching signal when the first logical signal has the second logic and the second logical signal has the first logic.

Upon receipt of the fixing command, the interface circuit generates the first and second logical signals. Then, the logical circuit generates the first or second word configuration switching signal when either of the first and second logical signals has the first logic.

Therefore, in accordance with the present invention, by receiving the fixing command, it is possible to generate the word configuration switching signal for switching the word configurations inside the semiconductor memory device. As a result, it is possible to make a switchover between the word configurations of the semiconductor memory device without providing an input/output terminal receiving a command for switching the word configurations.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
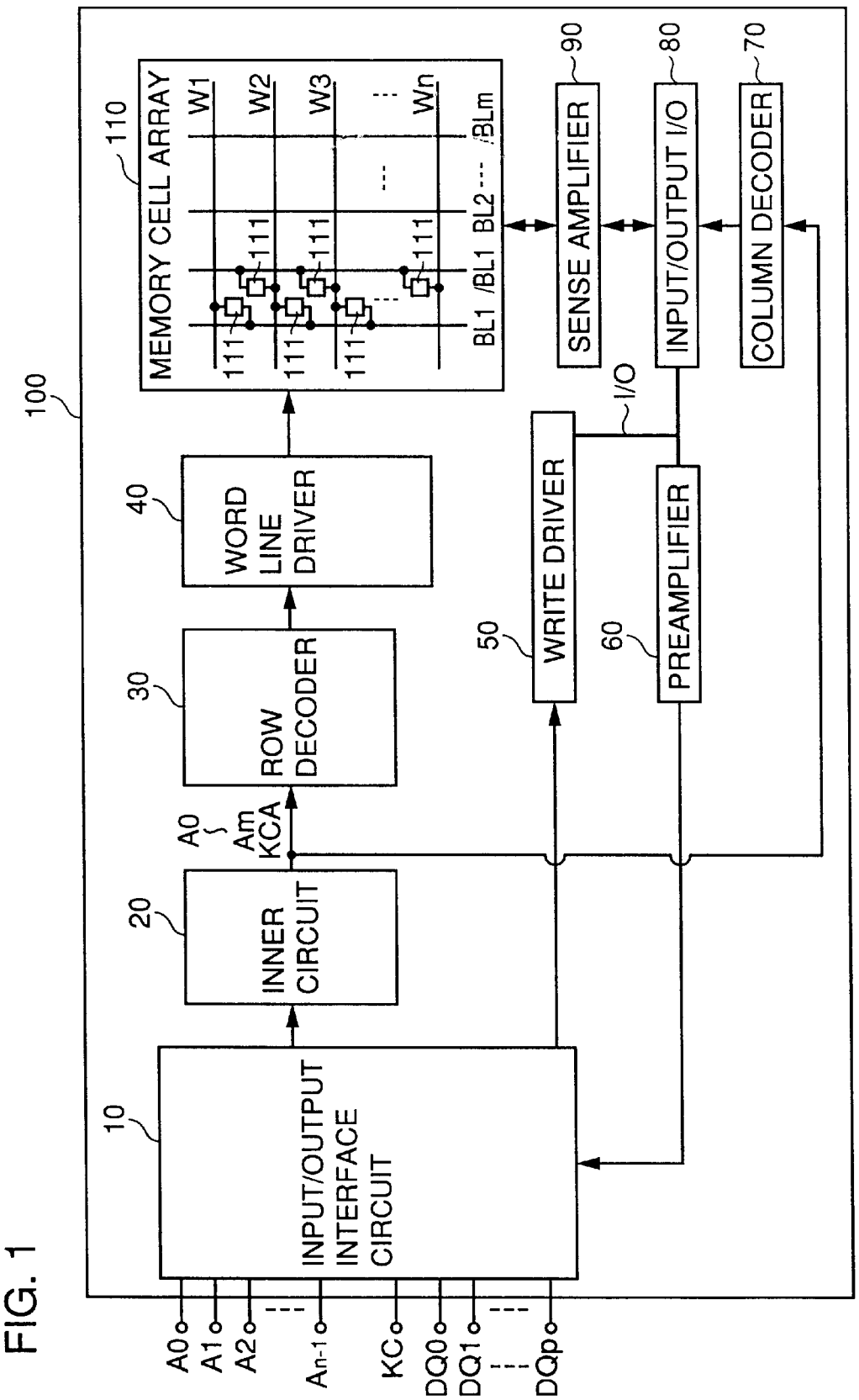
FIG. 1 is a schematic block diagram of a semiconductor memory device in accordance with the first embodiment.

Referring to Figures, the following description will discuss embodiments of the present invention. Here, in the Figures, the same members or identical members are indicated by the same reference numerals, and the description thereof is omitted.

[First Embodiment]

As illustrated in FIG. 1, the semiconductor memory device 100 in accordance with the first embodiment of the present invention comprises of an input/output interface circuit 10, an inner circuit 20, a row decoder 30, a word line driver 40, a write driver 50, a preamplifier 60, a column decoder 70, an input/output I/O 80, a sense amplifier 90, and a memory cell array 110. The write driver 50, the preamplifier 60 and the input/output I/O 80 are connected by an input/output line I/O.

The input/output interface circuit 10 receives an address signal, data, a command signal, etc. through an input/output terminal, outputting these to the inner circuit 20 and the write driver 50, and also outputs data received from the preamplifier 60 to the input/output terminal.

In normal operation, the inner circuit 20 outputs address signals A0 to An−1 received through the input/output interface circuit 10 to the row decoder 30 and the column decoder 70. Moreover, in a test mode, upon receipt of a fixing command KC and address signals A0 to Am −1 (m<n) receipt of a fixing command KC and address signals A0 to Am −1 (m<n) the number of which is smaller than that in normal operation through the input/output interface circuit 10, the inner circuit 20 generates n−m number of fixed logic signals KCA fixing the logic of address signals Am to Am−1 without being inputted to either one of the sides by using the method described later, and outputs an inner address signal INAD consisting of the resulting fixed logic signals KCA and the address signals A0 to Am−1 to the row decoder 30 and the column decoder 70.

The row decoder 30 decodes the inner address signal INAD received from the inner circuit 20, and outputs the resulting row address to the word line driver 40. The word line driver 40 activates one of the word lines W1 to Wn corresponding to the row address from the row decoder 30.

Upon writing data in a memory cell, the write driver 50 writes data from the input/output interface circuit 10 in paired bit lines BL1, /BL1 to BLm, /BLm connected to the input/output line I/O by the input/output I/O 80.

Upon reading data from the memory cell, the preamplifier 60 further amplifies data that has been output by the paired bit lines BL1, /BL1 to BLm, /BLm connected to the input/output line I/O by the input/output I/O 80 and amplified by the sense amplifier 90, and outputs the resulting data to the input/output interface circuit 10.

The column decoder 70 decodes the inner address signal INAD received from the inner circuit 20, and outputs the decoded column address to the input/output I/O 80. The input/output I/O 80 connects the paired bit lines BL1, /BL1 to BLm, /BLm selected by the column addresses from the column decoder 70 to the input/output line I/O.

Upon reading data from the memory cell, the sense amplifier 90 amplifies the data output by the selected paired bit lines BL1, /BL1 to BLm, /BLm. The memory cell array 110 includes a plurality of memory cells 111, a plurality of word lines W1 to Wn and a plurality of paired bit lines BL1, /BL1 to BLm, /BLm.

Upon receipt of a row address strobe signal /RAS of L (logical Low) level, a column address strobe signal /CAS of L level, a write enable signal /WE of L level and an address signal of a specific pattern, the semiconductor memory device 100 is shifted to the test mode. In the present invention, upon carrying out a test on the semiconductor memory device 100, address signals A0 to Am−1 the number of which is smaller than that of address signals A0 to An−1 input in normal operation are input thereto. In other words, a test device having test pins that is fewer than the address pins of the semiconductor memory device 100 is used for the test on the semiconductor memory device 100.

Figure 2:
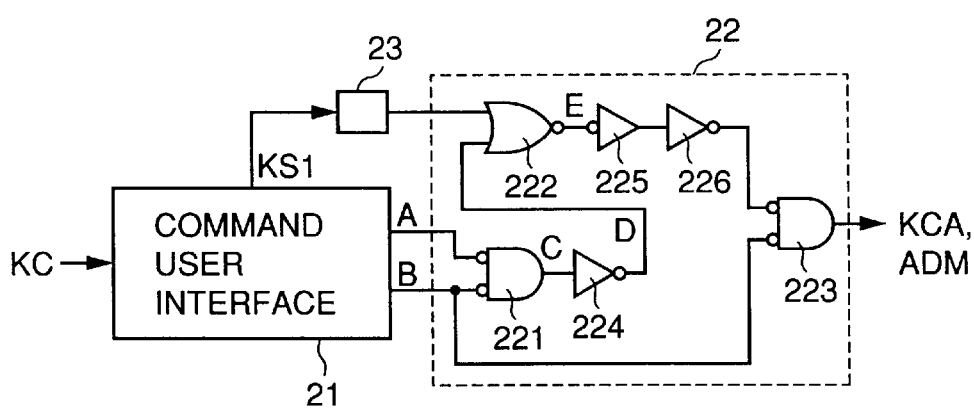
FIG. 2 shows a block diagram and a circuit diagram of an inner circuit in the semiconductor memory device shown in FIG. 1.
Figure 3:
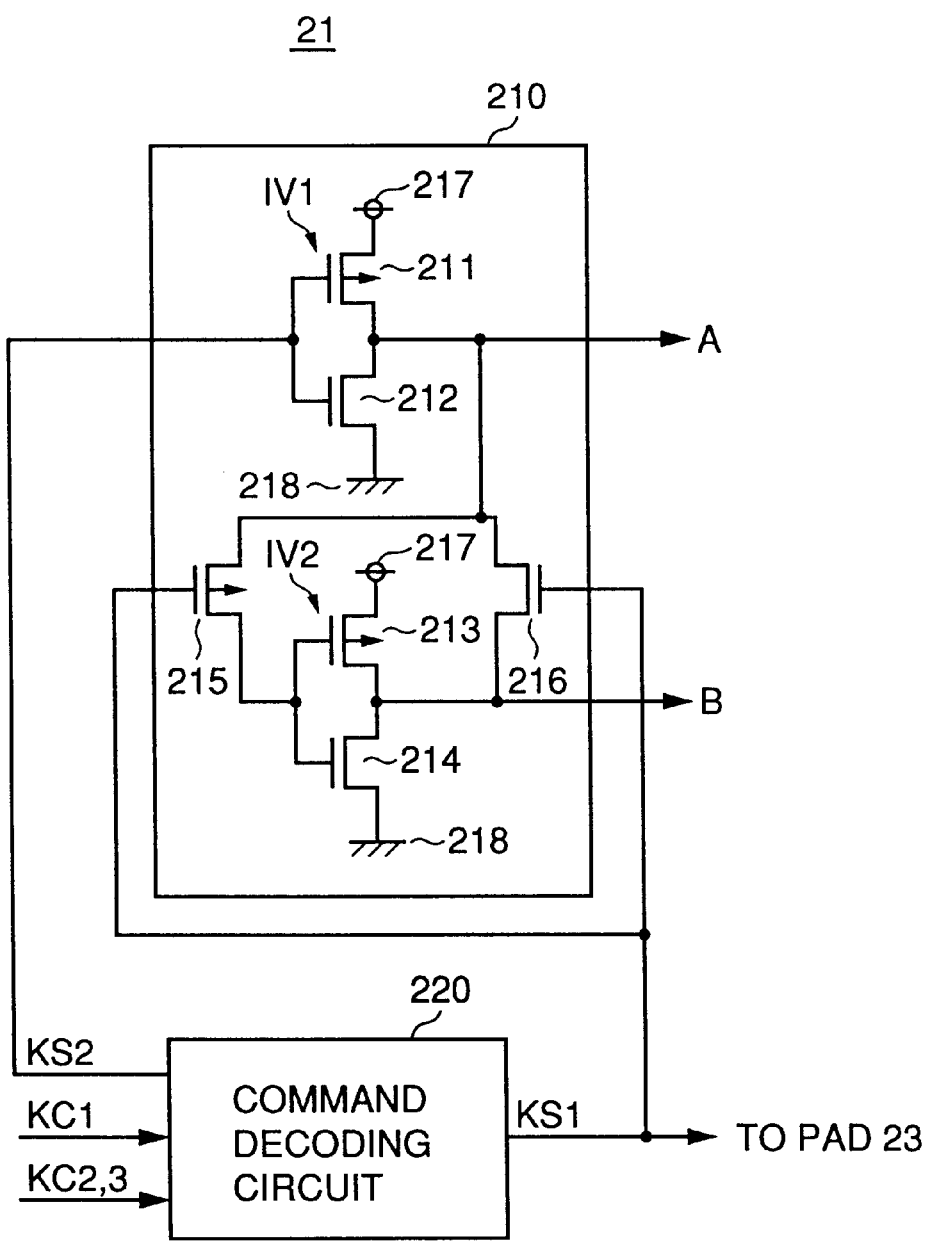
FIG. 3 is a circuit diagram of a command user interface shown in FIG. 2.
Figure 4:
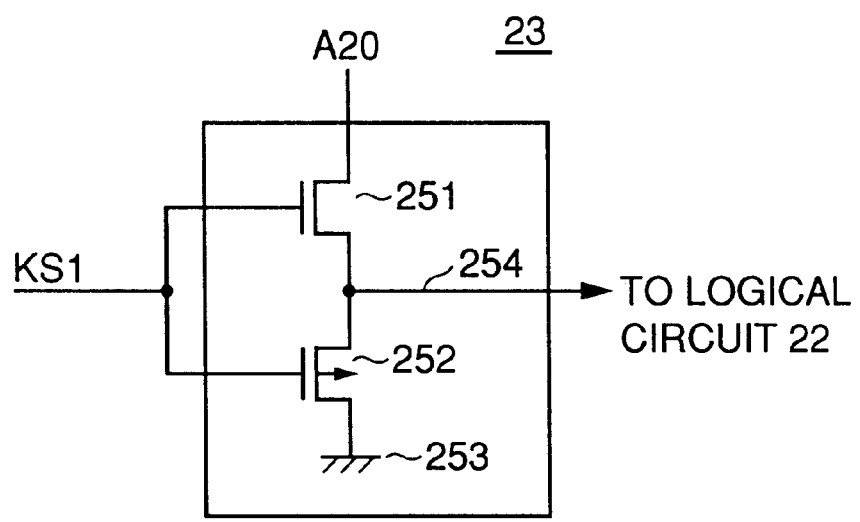
FIG. 4 is a circuit diagram of a pad portion in the inner circuit shown in FIG. 2.

Referring to FIGS. 2 to 4, an explanation will be given of a case in which the test pins of a test device are fewer than the address pins of the semiconductor memory device 100 by one pin. Here, it is supposed that the total number of the pins of the semiconductor memory device 100 is 52 and that among these, 21 pins are address pins used for receiving address signals A0 to A20. Further, it is supposed that the number of the test pins of the test device is 20.

As illustrated in FIG. 2, the inner circuit 20 includes a command user interface 21, a logical circuit 22 and a pad 23. The logical circuit 22 is formed of NOR gates 221 to 223 and inverters 224 to 226.

Based upon the fixing command KC input through the input/output interface circuit 10, the command user interface 21 generates signals A and B of H (logical High) level or L level, and outputs the generated signals A and B to the logical circuit 22. The fixing command KC fixes address signals A20 without being input to H level or L level, or outputs address signals input from the pad 23 as they are; and this command includes commands KC1 to KC3 of 8 bits that are consecutively input.

Upon receipt of the signal A of H level and the signal B of L level or the signal A of L level and the signal B of H level, the logical circuit 22 outputs a fixed logic signal KCA of H level or a fixed logic signal KCA of L level. Moreover, upon receipt of the signals A and B of L level, the logical circuit 22 outputs the address signal ADM input from the pad 23 as they are.

As will be described later, upon receipt of the command to fix the address signal A20 without being input in a test mode, the pad 23 is circuit 22. Moreover, upon receipt of a command not to fix the address signal A20, the pad 23 is connected to the address pin receiving the address signal A20 based upon the output signal KS1 from the command user interface 21.

As illustrated in FIG. 3, the command user interface 21 includes a logical circuit 210 and a command decoding circuit 220. The logical circuit 210 is constituted by P-channel MOS transistors 211, 213 and 215 and N-channel MOS transistors 212, 214 and 216. The P-channel MOS transistor 211 and the N-channel MOS transistor 212 are series-connected between a power supply node 217 and a grounding node 218 so as to form an inverter IV 1. Moreover, the P-channel MOS transistor 213 and the N-channel MOS transistor 214 are series-connected between the power supply node 217 and the grounding node 218 so as to form an inverter IV 2.

The P-channel MOS transistor 215 is placed between the output terminal of the inverter IV 1 and the input terminal of the inverter IV 2 and receives the output signal KS1 from the command decoding circuit 220 at its gate terminal. Moreover, the N-channel MOS transistor 216 is placed between the output terminal of the inverter IV 1 and the output terminal of the inverter IV 2 and receives the output signal KS1 from the command decoding circuit 220 at its gate terminal. Moreover, the command decoding circuit 220 decodes commands KC2 and KC3, and based upon the results of the decoding, an output signal KS2 is released and input to the inverter IV 1.

The command decoding circuit 220 receives the command KC1 that is first input to the command user interface 21 among the fixing commands KC, and based upon the results of the decoding of the command KC1, outputs the output signal KS1 of H level or L level to the P-channel MOS transistor 215 and the N-channel MOS transistor 216 of the logical circuit 210 as well as to the pad 23. Moreover, the command decoding circuit 220 receives the commands KC2 and KC3, and based upon the results of the decoding of the commands KC2 and KC3, outputs the output signal KS2 of H level or L level to the inverter IV 1 of the logical circuit 210.

Either "00001111" indicating that the address signal A20 is to be fixed to H level or L level or "10101010" indicating that the address signal A20 is not to be fixed to H level or L level is input to the command decoding circuit 220 as the command KC1. Upon receipt of the command KC1 of "00001111", the command decoding circuit 220 releases the output signal KS1 of L level, and upon receipt of the command KC1 of "10101010", it releases the output signal KS1 of H level.

Moreover, the commands KC2 and KC3, which are input following the command KC1, consist of, for example, "11001100" or "00110011". Upon receipt of the commands KC2 and KC3 consisting of the pattern "11001100", the command decoding circuit 220 releases the output signal KS2 of L level, and upon receipt of the commands KC2 and KC3 consisting of the pattern "00110011", the command decoding circuit 220 releases the output signal KS2 of H level. Here, the 8-bit patterns "00001111", "10101010", "11001100" and "00110011" are given as examples, and patterns other than these may be used.

Upon receipt of the output signal KS1 of L level from the command decoding circuit 220, the logical circuit 210 turns the P-channel MOS transistor 215 on and the N-channel MOS transistor 216 off, thereby connecting the inverter IV 2 to the inverter IV 1 in series with each other. Further, upon receipt of the output signal KS2 of L level from the command decoding circuit 220, the logical circuit 210 outputs a signal A of H level and a signal B of L level, and upon receipt of the output signal KS2 of H level from the command decoding circuit 220, it outputs the signal A of L level and the signal B of H level.

Moreover, upon receipt of the output signal KS1 of H level from the command decoding circuit 220, the logical circuit 210 turns the P-channel MOS transistor 215 off and the N-channel MOS transistor 216 on, thereby making the inverter IV 2 inactive. Then, upon receipt of the output signal KS2 of H level from the command decoding circuit 220, the logical circuit 210 outputs the signal A and signal B of L level.

As illustrated in FIG. 4, the pad 23 is constituted by an N-channel MOS transistor 251, a P-channel MOS transistor 252 and an output node 254. The N-channel MOS transistor 251 and the P-channel MOS transistor 252 receive the output signal KS1 of the command decoding circuit 220 of the command user interface 21 at their gate terminals. Upon receipt of the output signal KS1 of H level, the pad 23 turns the N-channel MOS transistor 251 on and the P-channel MOS transistor 252 off, thereby outputting the address signal A20 received from the address pin to the logical circuit 22 from the output node 254. Moreover, upon receipt of the output signal KS1 of L level, the pad 23 turns the N-channel MOS transistor 251 off and the P-channel MOS transistor 252 on, thereby outputting a signal of L level received from the grounding node 253 to the logical circuit 22 from the output node 254.

Figure 5:
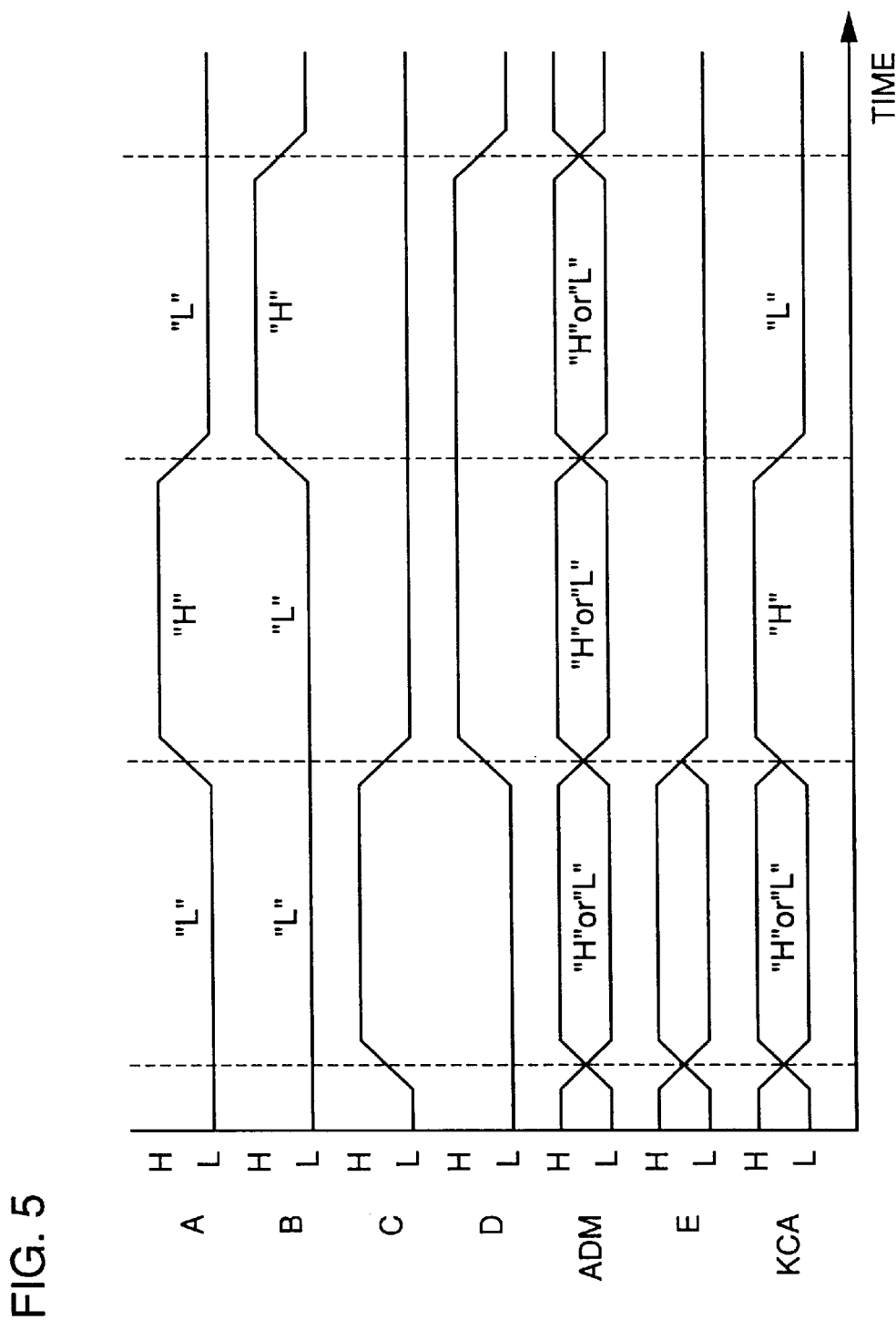
FIG. 5 is a timing chart of signals used in the inner circuit of FIG. 2.

As illustrated in FIG. 2 and FIG. 5, when the command user interface 21 outputs the signal A of H level and the signal B of L level as well as outputting the output signal KS1 of L level, the NOR gate 222 of the logical circuit 22 receives a signal of L level at one of its terminals. Then, the NOR gate 221 outputs a signal C of L level, and the inverter 224 outputs a signal D of H level. Thus, based upon the H level signal D and the L level signal received from the pad 23, the NOR gate 222 outputs a signal E of L level. Since the inverters 225 and 226 invert the signal E twice, the NOR gate 223 receives the L level signal B and the L level signal E and outputs a fixed logic signal KCA of H level. In this manner, the fixed logic signal KCA fixing the address signal A20 to H level is generated.

Moreover, when the command user interface 21 outputs the signal A of L level and the signal B of H level as well as outputting the L level output signal KS1, the NOR gate 222 of the logical circuit 22 receives the L level signal at one of its terminals. Then, the NOR gate 221 outputs the signal C of L level, and the inverter 224 outputs the signal D of H level. Thus, based upon the H level signal D and the L level signal received from the pad 23, the NOR gate 222 outputs a signal E of L level. Since the inverters 225 and 226 invert the signal E twice, the NOR gate 223 receives the H level signal B and the L level signal E and outputs a fixed logic signal KCA of L level. In this manner, the fixed logic signal KCA fixing the address signal A20 to L level is generated.

As clearly explained above, when the command user interface 21 outputs signals A and B either of which is H level, the inverter 224 always outputs the signal D of H level, therefore, the NOR gate 222 outputs the signal E of L level independent of the logical level of the signal received from the pad 23. Therefore, even when the pad 23 is connected to the address pin receiving the address signal A20, the NOR gate 222 outputs a signal of L level independent of the logical level of the address signal A20. For this reason, when the command user interface 21 outputs signals A and B either of which is H level, the signal of L level received from the grounding node 253 is output to the NOR gate 222 as described above.

When the command user interface 21 outputs the signals A and B of L level as well as outputting the H level output signal KS1, the pad 23 outputs the address signal A20 to one of the terminals of the NOR gate 222 as described above. Moreover, the NOR gate 221 outputs the signal C of H level and the inverter 224 outputs the signal D of L level. Then, when the address signal A20 is L level the NOR gate 222 outputs the signal E of H level, and when the address signal A20 is H level outputs the signal E of L level. In other words, the NOR gate 222 outputs the signal E obtained by inverting the address signal A20.

As described above, since the inverters 225 and 226 output signals obtained by inverting the signal E twice, the NOR gate 223 receives the signal B and the signal E. Then, when the signal E is H level, the NOR gate 223 outputs the signal ADM of L level, and when the signal E is L level, it outputs the signal ADM of H level. Therefore, the logical circuit 22 outputs the address signal A20, as it is, after passing through the following processes: the L level address signal A20→H level signal E→L level signal ADM or after passing through the following processes: the H level address signal A20→H level signal E→L level signal ADM.

The reason that the logical circuit 22 is arranged to output the address signal A20, as it is, through the pad 23 is because, when a test device having 21 pins can be used, the address signal A20, as it is, input from the address pin is used for the test without generating the fixed logical signal KCA instead of the address signal A20.

Based upon the fixing command KC as described above, the inner circuit 20 generates the fixed logic signal KCA instead of the address signal A20, and outputs an inner address signal INAD that is formed by combining the fixed logic signal KCA and the address signals A0 to A19 input through the address pins. Therefore, when a semiconductor memory device 100 is tested by the test device having 20 pins, the inner circuit 20 generates the fixed logic signal KCA instead of the address signal A20, and when it is tested by a test device with 21 pins, the inner circuit 20 generates the address signal A20, as it is, without generating the fixed logic signal KCA.

Referring to FIG. 1 again, when the semiconductor memory device 100 is shifted to the test mode and when the address signals A0 to A19 received from the test device and the fixing command KC are input, the inner circuit 20 receives the address signals A0 to A19 and the fixing command KC through the input/output interface 10. Then, as described above, based upon the fixing command KC, the inner circuit 20 generates a fixed logic signal KCA fixing the address signal A20 to H level. Further, the inner circuit 20 outputs the address signals A0 to A19 and the fixed logic signal KCA of H level to the row decoder 30 and the column decoder 70.

Based upon the address signals A0 to A19 and the fixed logic signal K of H level, the row decoder 30 decodes a row address fixing the address signal A20 to H level, and outputs the decoded row address to the word line driver 40. The word line driver 40 activates word lines W1 to Wn corresponding to the row address fixing the address signal A20 to H level.

Based upon the address signals A0 to A19 and the fixed logic signal KCA of H level, the column decoder 70 decodes a column address fixing the address signal A20 to H level, and outputs the decoded column address to the input/output I/O 80. The input/output I/O 80 connects paired bit lines BL1, /BL1 to BLm, /BLm corresponding to the column address fixing the address signal A20 to H level to the input/output line I/O.

Upon receipt of write data from the input/output terminals DQ0 to DQp, the input/output interface circuit 10 outputs the write data to the write driver 50. Then, the write driver 50 writes write data in the paired bit lines BL1, /BL1 to BLm, /BLm connecting to the input/output line I/O. Thus, data is written in memory cells 111 that are activated by the word lines W1 to Wn and the paired bit lines BL1, /BL1 to BLm, /BLm.

In the same manner as described above, after the data has been written, the row decoder 30 and the column decoder 70 respectively decode a row address and a column address fixing the address signal A20 to H level. The word line deliver 40 activates word lines W1 to Wn corresponding to the row address, and the input/output I/O 80 connects paired bit lines BL1, /BL1 to BLm, /BLm corresponding to the column address to the input/output line I/O. Then, data read out from memory cells 111 that have been activated by the word lines W1 to Wn and the paired bit lines BL1, /BL1 to BLm, /BLm is amplified by the sense amplifier 90, and output to the input/output line I/O. The preamplifier 60 further amplifies the read data on the input/output line I/O, and outputs the resulting data to the input/output interface circuit 10. The input/output interface circuit 10 externally outputs the read data through the input/output terminals DQ0 to DQp. The test device compares the read data from the input/output terminals DQ0 to DQp with the write data, thereby carrying out testing processes on the respective memory cells 111.

In this manner, the data-write and data-read testing processes are completed with the address signal A20 fixed to H level.

The test device outputs commands KC2, KC3 to fix the address signal A20 to L level to the semiconductor memory device 100. Then, based upon the commands KC2, KC3 input through the input/output interface circuit 10, the inner circuit 20 generates a fixed logic signal KCA having the address signal A20 to L level in accordance with the method as described above. Then, the inner circuit 20 outputs the address signals A0 to A19 and the fixed logic signal KCA of H level to the row decoder 30 and the column decoder 70.

The row decoder 30 decodes the row address fixing the address signal A20 to L level as described above, and the column decoder 70 decodes the column address fixing the address signal A20 to L level. Thereafter, in the same method as described above, data-write and data-read testing processes on the respective memory cells are carried out.

In the above-mentioned testing method, the fixed logic signal KCA of H level or L level are generated in place of the address signal A20 without being input through the address pin, and based upon the fixed logic signal KCA and the input address signals A0 to A19, the row address and column address are decoded. Therefore, the address signal A20 is actually generated inside the semiconductor memory device 100, and based upon the generated address signal and the input address signal, the row address and the column address are decoded.

When a testing process is carried out on the semiconductor memory device 100 by a test device with 21 pins, the test device outputs address signals A0 to A20 and a fixing command KC containing a command KC1 without fixing the address signal to the semiconductor memory device 100. Then, the inner circuit 20 receives the address signals A0 to A20 and the fixing command KC through the input/output interface circuit 10, and by using the above-mentioned method, outputs the address signals A0 to A20 to the row decoder 30 and the column decoder 70. In other words, normally used address signals A0 to A20 are output to the row decoder 30 and the column decoder 70. Thus, the testing processes are carried out on the respective memory cells in accordance with the above-mentioned method.

Figure 6:
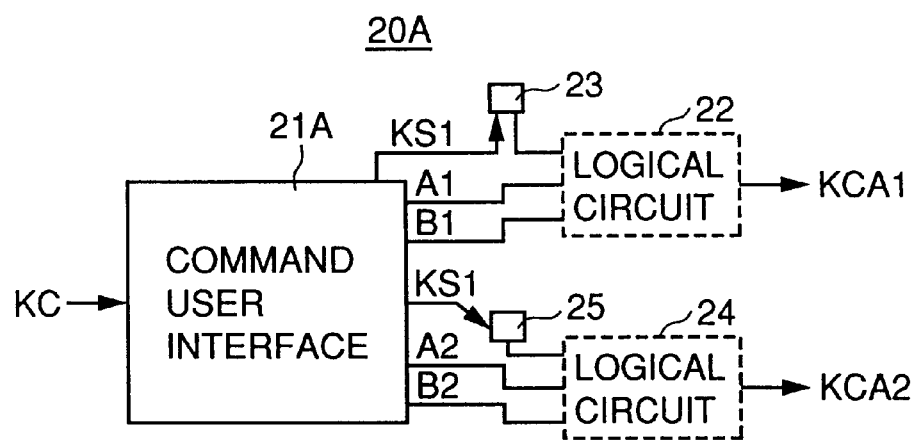
FIG. 6 shows another block diagram and circuit diagram of the inner circuit in the semiconductor memory device shown in FIG. 1.

Referring to FIG. 6, an explanation will be given of a case in which two of the address signals are not input in a test mode. In other words, a testing process is carried out on the semiconductor memory device 100 by using a test device having 19 pins. Here, it is assumed that address signals without being input to the semiconductor memory device 100 are address signals A19 and A20. In this case, the semiconductor memory device 100 comprises of an inner circuit 20A in place of the inner circuit 20. The inner circuit 20A includes a command user interface 21A, logical circuits 22 and 24 and pads 23 and 25. The pad 23 is connected to the logical circuit 22, and the pad 25 is connected to the logical circuit 24.

The command user interface 21A is constituted by two command interfaces. Each of the two command interfaces is constituted by a logical circuit 210 and a command decoding circuit 220 shown in FIG. 3. Therefore, each of the two command interfaces has the same function as the command user interface 21 shown in FIG. 2.

Based upon the commands KC1 to KC3, one of the two command interfaces outputs signals A1 and B1 of H level or L level to the logical circuit 22. Moreover, based upon the commands KC1 to KC3, the other command interface outputs signals A2 and B2 of H level or L level to the logical circuit 24.

The logical circuit 24 has the same construction as the logical circuit 22 shown in FIG. 2. Based upon the signals A1 and B1, the logical circuit 22 outputs the fixed logical signal KCA1 being fixed to H level or L level by using the method as described above. Based upon the signals A2 and B2, the logical circuit 24 outputs the fixed logical signal KCA2 being fixed to H level or L level by using the method as described above.

Moreover, when the pad 23 or 25 is connected to an address pin, each of the logical circuits 22 and 24 has the aforementioned arrangement in which they put the address signal A19 or A20, as it is, received through the corresponding address pin.

Moreover, when a testing process is carried out on the semiconductor memory device 100 by using a test device having 20 pins, the logical circuit 24 outputs the address signal A19 received through the pad 25, as it is, and the logical circuit 22 outputs the fixed logic signal KCA1 fixing the address signal A20 to H level or L level.

In this manner, depending on the number of test pins of the test device, the inner circuit 21A generates the fixed logic signals the number of which opposes the number of address signals that are output as they are.

Referring to FIG. 1 again, when a testing process is carried out on the semiconductor memory device 100 by using a test device having 19 pins, the inner circuit 21A outputs the address signals A0 to A18 and the fixed logical signals KCA1 and KCA2 to the row decoder 30 and the column decoder 70. Based upon the address signals A0 to A18 and the fixed logic signals KCA1 and KCA2, the row decoder 30 decodes a row address fixing the address signal A19 to H level or L level and the address signal A20 to H level or L level, and outputs the resulting signal to the word line driver 40.

Moreover, based upon the address signals A0 to A18 and the fixed logic signals KCA1 and KCA2, the column decoder 70 decodes a column address fixing the address signal A19 to H level or L level and the address signal A20 to H level or L level, and outputs the resulting signal to the input/output I/O 80.

Thereafter, the testing operation of the semiconductor memory device 100 are carried out as described above.

Moreover, when the testing process is carried out on the semiconductor memory device 100 by using a test device having 20 pins, the inner circuit 21A outputs the address signals A0 to A19 and the fixed logical signal KCA2 to the row decoder 30 and the column decoder 70. Based upon the address signals A0 to A19 and the fixed logic signals KCA2, the row decoder 30 decodes a row address fixing the address signal A20 to H level or L level, and outputs the resulting signal to the word line driver 40.

Moreover, based upon the address signals A0 to A19 and the fixed logic signal KCA2, the column decoder 70 decodes a column address fixing the address signal A20 to H level or L level, and outputs the resulting signal to the input/output I/O 80.

Thereafter, the testing operation of the semiconductor memory device 100 are carried out as described above.

Moreover, when the testing process is carried out on the semiconductor memory device 100 by using a test device having 21 pins, the inner circuit 21A outputs the address signals A0 to A20 to the row decoder 30 and the column decoder 70. Based upon the address signals A0 to A20, the row decoder 30 decodes a row address, and outputs the resulting signal to the word line driver 40.

Moreover, based upon the address signals A0 to A20, the column decoder 70 decodes a column address, and outputs the resulting signal to the input/output I/O 80.

Thereafter, the testing operation of the semiconductor memory device 100 are carried out as described above.

Figure 7:
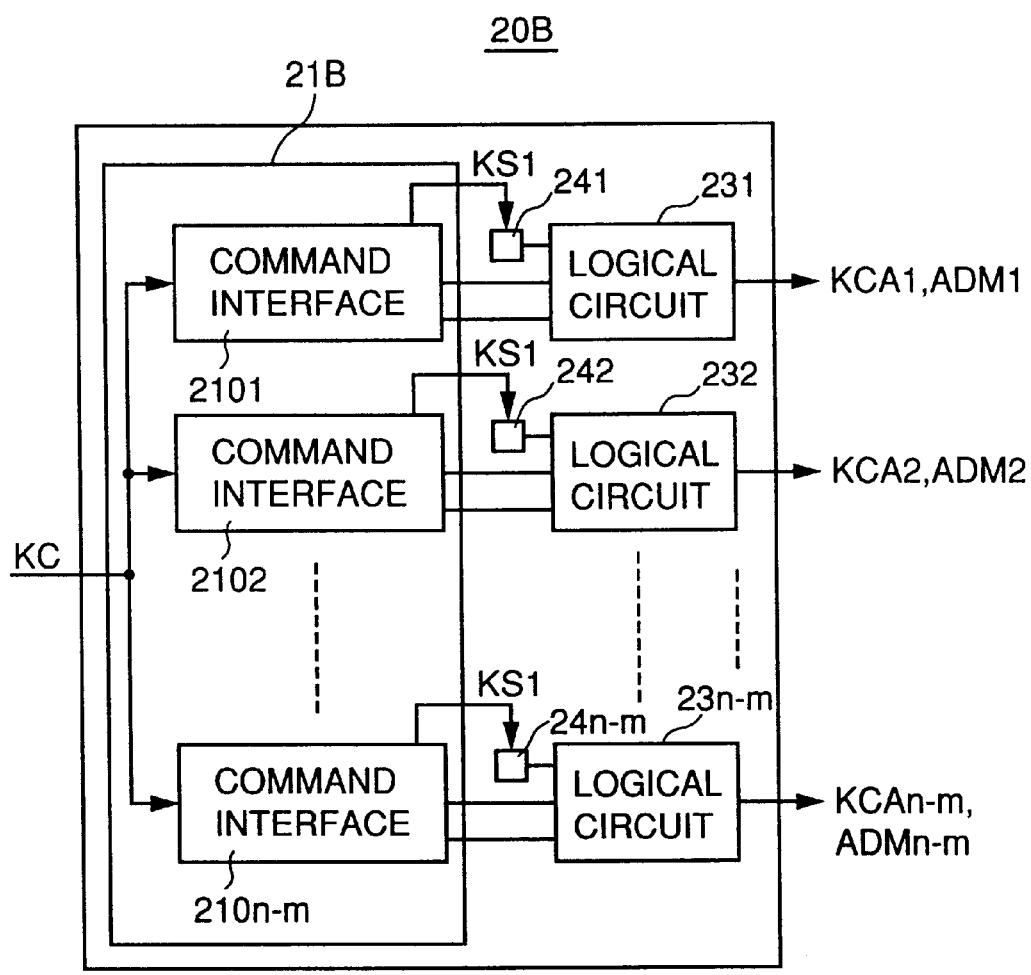
FIG. 7 shows still another block diagram and circuit diagram of the inner circuit in the semiconductor memory device shown in FIG. 1.

Referring to FIG. 7, an explanation will be given of a case in which, among address signals A0 to An−1, address signals A0 to Am−1 are input while the address signals Am to An−1 are not input. In other words, a testing operation is carried out on the semiconductor memory device 100 by using a test device having m (m is a natural number smaller than n) number of pins. In this case, the semiconductor memory device 100 comprises of an inner circuit 20B in place of the inner circuit 20. The inner circuit 20B includes a command user interface 21B, logical circuits 231 to 23n and pads 241 to 24n−m. These pads 241 to 24n−m are respectively connected to the logical circuits 231 to 23n−m.

The command user interface 21B is constituted by command interfaces 2101 to 210n−m. Each of the command interfaces 2101 to 210n−m is constituted by the logical circuit 210 and the command decoding circuit 220 shown in FIG. 3.

Each of the logical circuits 231 to 23n−m has the same construction as the logical circuit 22 shown in FIG. 2. Each of the pads 241 to 24n−m has the same construction as the pad 23 shown in FIG. 4. The command interfaces 2101 to 210n−m respectively release the output signals KS1 to the pads 241 to 24n−m.

When the address signals Am to An−1 are fixed to H level or L level, the logical circuits 231 to 23n−m respectively generate fixed logic signals KCA1 to KCAn−m by using the aforementioned method. Moreover, when the pads 241 to 24n−m are connected to the address pins, the logical circuits 231 to 23n−m respectively output address signals ADML to ADMn−m. These address signals ADMi to ADMn−m respectively correspond to the address signals Am to An−1.

Here, when a testing process is carried out on the semiconductor memory device 100 by using a test device having m+1 or more pins, the logical circuits 231 to 23n−m are divided into the logical circuits for outputting fixed logical signals KCA1 to KCAn−m fixing the address signal to H level or L level, and the logical circuits for outputting the address signals Am to An−1, as they are, received from the pads 241 to 24n−m, depending on the number of pins. signals Am to An−1, as they are, received from the pads 241 to 24n−m, depending on the number of pins.

In this manner, depending on the number of test pins of the test device, the inner circuit 21B generates the fixed logic signals the number of which opposes the number of address signals that are output as they are, with respect to the number of test pins.

Referring to FIG. 1 again, when a testing process is carried out on the semiconductor memory device 100 by using a test device having m number of pins, an inner circuit 21B outputs address signals A0 to Am−1 and fixed logic signals KCA1 to KCAn−m to the row decoder 30 and the column decoder 70. Based upon the address signals A0 to Am−1 and the fixed logic signal KCA1 to KCAn−m, the row decoder 30 decodes row addresses fixing the address signals Am to An−1 to H level or L level, and outputs the resulting signal to the word line driver 40.

Moreover, based upon the address signals A0 to Am−1 and the fixed logic signal KCA1 to KCAn−m, the column decoder 70 decodes column addresses fixing the address signals Am to An−1 to H level or L level, and outputs the resulting signal to input/output I/O 80.

Thereafter, the testing operation of the semiconductor memory device 100 is carried out as described above.

In the semiconductor memory device in accordance with the first embodiment of the present invention, the relationship between the number of address pins and the number of address pins for the test device is shown in Table 1. The number of address pins of a semiconductor memory device with quality A is represented by x, that of a semiconductor memory device with quality B is represented by x+1, that of a semiconductor memory device with quality C is represented by x+2, and that of a semiconductor memory device with quality k is represented by x+k. Here, the number of address pins for the test device is represented by x.

TABLE 1

|  | Number of address pins of chip | Number of address pins for jig of tester |
|---|---|---|
| Quality A | x | x |
| Quality B | x + 1 |  |
| Quality C | x + 2 |  |
| . | . |  |
| . | . |  |
| . | . |  |
| Quality k | x + k |  |

In this case, in the semiconductor memory device with quality A, since the number of address pins is the same as the number of the address pins for the test device, a normal testing operation can be carried out. In the semiconductor memory device with quality B, since the number of address pins is greater than that of the address pins of the test device by one, one address signal is internally fixed to H level or L level so that it is possible to carry out the test on all the memory cells.

In the same manner, in the semiconductor memory device with quality C, two address signals are fixed to H level or L level, k number of address signals in the semiconductor memory device with quality k are fixed to H level or L level so that it is possible to carry out the test on all the memory cells.

In the above-mentioned embodiment, explanations have been given of cases where high order address signals are fixed to H level or L level among address signals input to the semiconductor memory device 100; however, the present invention is not limited thereby, and among address signals A0 to An−1, any desired address signals may be fixed.

In accordance with the first embodiment, when address signals the number of which is smaller than that of the address signals used in the normal operation is received in a test mode, the semiconductor memory device virtually generates address signals internally respect to the address signals without being inputted, therefore, even when the number of the test pins is smaller than the number of address pins, it is possible to carry out the test on all the memory cells.

Moreover, even when the number of address pins increases along with a newly developed semiconductor memory device with a high capacity, it is possible to carry out a testing operation with high quality without increasing the number of test pins in a test device.

[Second Embodiment]

Figure 8:
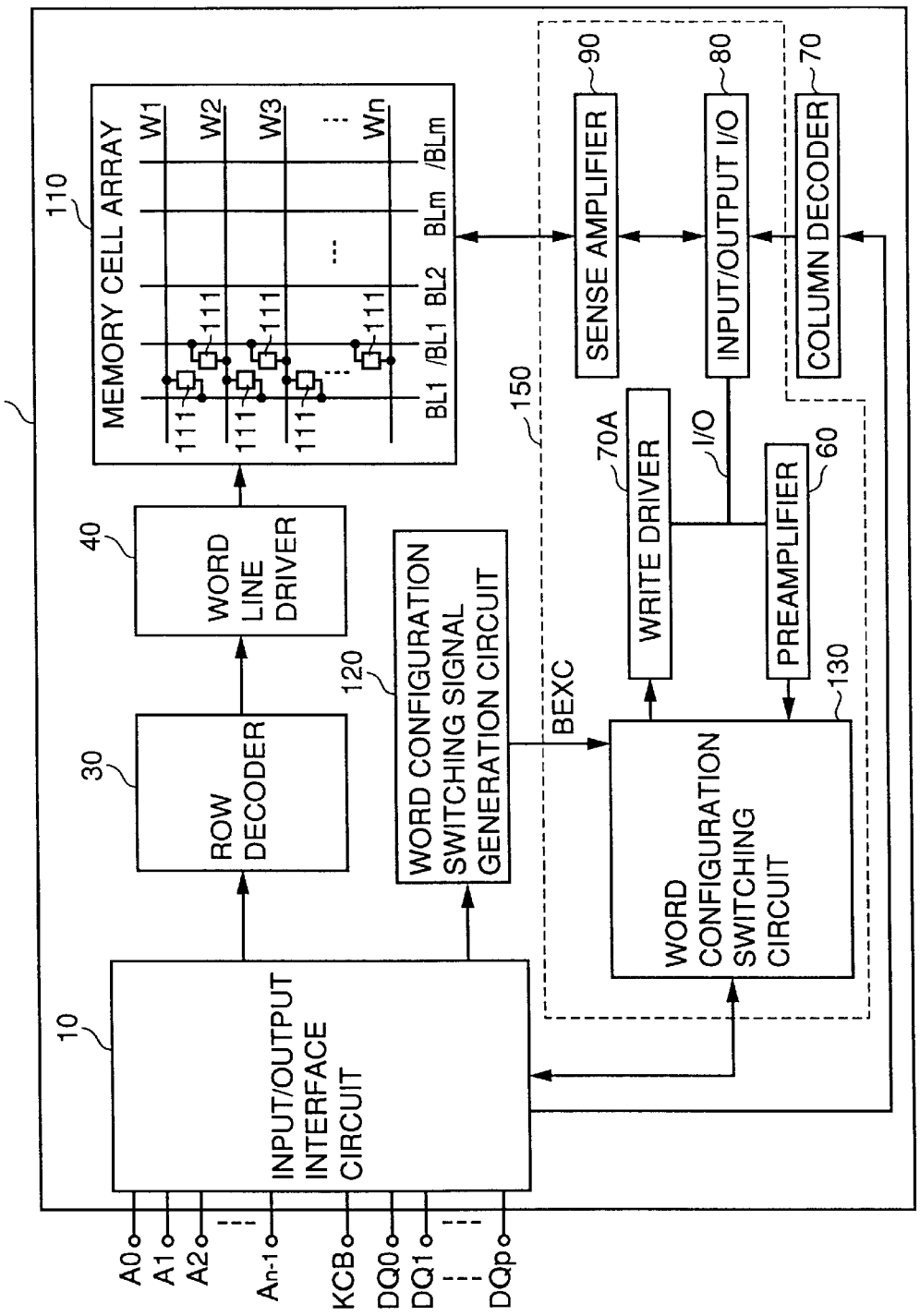
FIG. 8 is a schematic block diagram of a semiconductor memory device in accordance with the second embodiment.

As illustrated in FIG. 8, in a semiconductor memory device 200 in accordance with the second embodiment of the present invention, the inner circuit 20 of the semiconductor memory device 100 is removed, and a word configuration switching signal generation circuit 120 and a word configuration switching circuit 130 are added thereto. The other arrangements are the same as those of the semiconductor memory device 100.

Upon receipt of a fixing command KCB through the input/output interface circuit 10, the word configuration switching signal generation circuit 120 generates a word configuration switching signal BEXC for switching the word configuration of the semiconductor memory device 200 by using the method described later, and outputs the generated word configuration switching signal BEXC to the word configuration switching circuit 130.

The word configuration switching circuit 130 switches the word configuration of the semiconductor memory device 200 based upon the word configuration switching signal BEXC by using the method described later. In other words, for example, the word configuration switching circuit 130 switches a semiconductor memory device for inputting and outputting data with 16 bits to a semiconductor memory device for inputting and outputting data with 8 bits, and vice versa.

Figure 9:
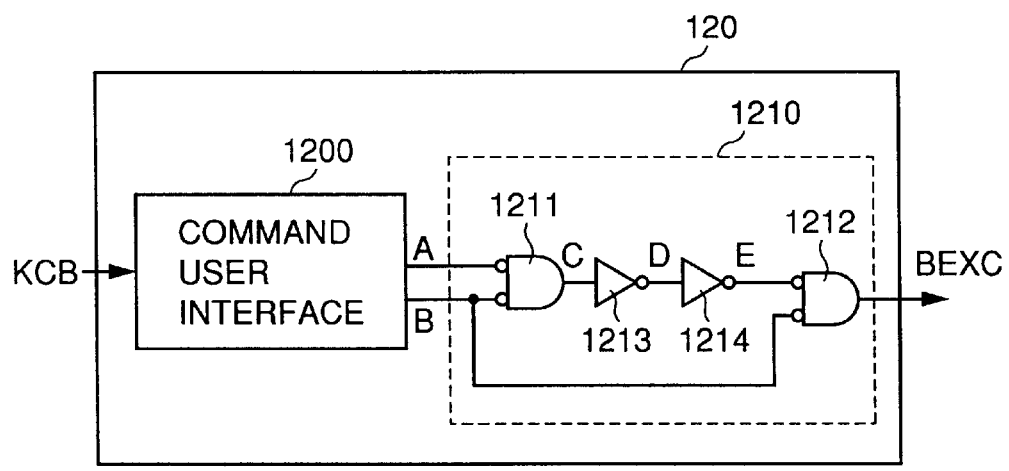
FIG. 9 is a circuit diagram of a word configuration switching signal generation circuit of the semiconductor memory device shown in FIG. 8.

As illustrated in FIG. 9, the word configuration switching signal generation circuit 120 comprises of a command user interface 1200 and a logical circuit 1210. The logical circuit 1210 is constituted by NOR gates 1211 and 1212, and inverters 1213 and 1214.

Figure 10:
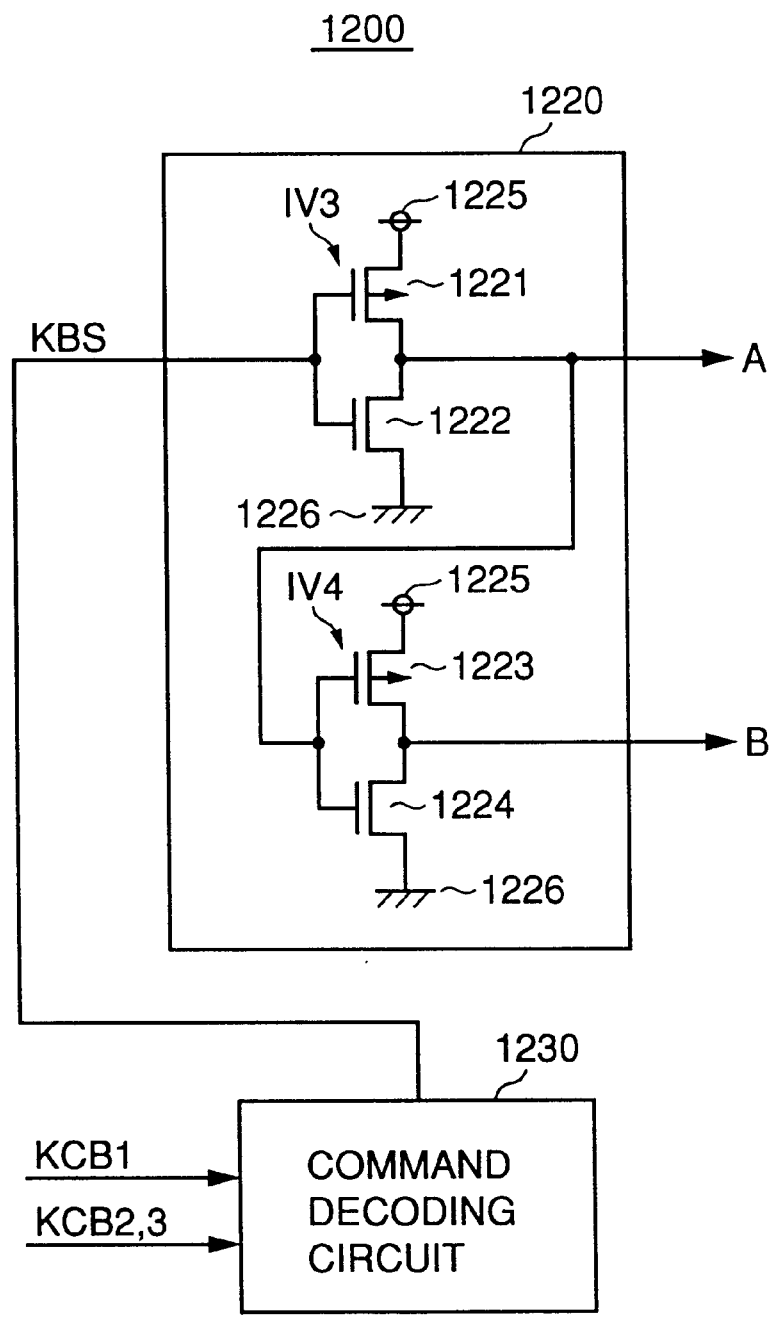
FIG. 10 is a circuit diagram of a command user interface of the word configuration switching signal generation circuit shown in FIG. 9.

As illustrated in FIG. 10, the command user interface 1200 includes a logical circuit 1220 and a command decoding circuit 1230. The logical circuit 1220 is constituted by P-channel MOS transistors 1221 and 1223 and N-channel MOS transistors 1222 and 1224. The P-channel MOS transistor 1221 and N-channel MOS transistor 1222 are placed between a power supply node 1225 and a grounding node 1226 so as to form an inverter IV 3. Moreover, the P-channel MOS transistor 1223 and N-channel MOS transistor 1224 are placed between the power supply node 1225 and the grounding node 1226 so as to form an inverter IV 4. The output terminal of the inverter IV 3 is connected to the input terminal of the inverter IV 4. An output signal KBS of the command decoding circuit 1230 is input to the inverter IV 3.

The fixing command KCB is a command for generating the word configuration switching signal, and for example, constituted by 8-bit commands KCB1 to KCB3 that are successively input. The command KCB1 is a command for shifting the semiconductor memory device 200 to a word configuration switching mode for switching the word configuration thereof. For example, "00011000" is given to the command decoding circuit 1230 as the command KCB1.

Commands KCB2 and KCB3, which are input following the command KCB1, are commands for directing how to switch the word configuration. For example, "10110111" or "11101101" is given to the command decoding circuit 1230 as the commands KCB2 and KCB3. The pattern "10110111" switches the word configuration from a smaller word configuration to a greater word configuration, and the pattern "11101101" switches the word configuration from a greater word configuration to a smaller word configuration.

Upon receipt of the command KCB1 consisting of a pattern "00011000", the command decoding circuit 1230 decodes the pattern "00011000", and enters a stand-by state for the commands KCB2 and KCB3 that are successively input thereto. Upon receipt of the commands KCB2 and KCB3 consisting of the pattern "11101101", the command decoding circuit 1230 releases an output signal KBS of L level to the logical circuit 1220. Moreover, upon receipt of the commands KCB2 and KCB3 consisting of the pattern "10110111", the command decoding circuit 1230 releases an output signal KBS of H level to the logical circuit 1220.

Then, based upon the output signal KBS of L level, the logical circuit 1220 outputs a signal A of H level and a signal B of L level. Further, based upon the output signal KBS of H level, the logical circuit 1220 outputs a signal A of L level and a signal B of H level.

Here, 8-bit patterns "1100011000", "11101101" and "10110111" are only given as examples, and patterns other than these may be used.

Figure 11:
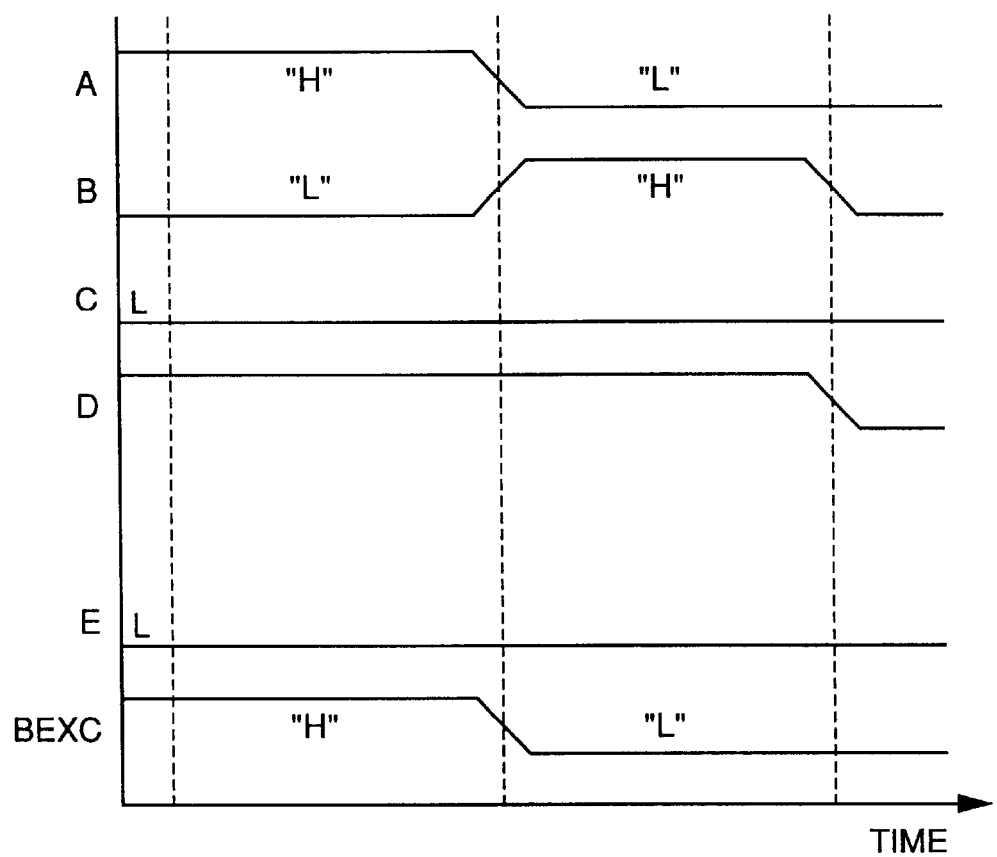
FIG. 11 is a timing chart of signals used in the word configuration switching signal generation circuit shown in FIG. 9.

As illustrated in FIGS. 9 and 11, upon receipt of the signal A of H level and the signal B of L level from the command user interface 1200, the NOR gate 1211 of the logical circuit 1210 outputs a signal C of L level, the inverter 1213 outputs a signal D of H level, and the inverter 1214 outputs a signal E of L level. Then, based upon the signals B and E of L level, the NOR gate 1212 outputs a word configuration switching signal BEXC of H level. Therefore, based upon the signal A of H level and the signal B of L level, the logical circuit 1210 outputs a word configuration switching signal BEXC of H level.

Moreover, upon receipt of the signal A of L level and the signal B of H level from the command user interface 1200, the NOR gate 1211 outputs a signal C of L level, the inverter 1213 outputs a signal D of H level, and the inverter 1214 outputs a signal E of L level. Then, based upon the signal B of H level and signal E of L level, the NOR gate 1212 outputs a word configuration switching signal BEXC of L level. Therefore, based upon the signal A of L level and the signal B of H level, the logical circuit 1210 outputs a word configuration switching signal BEXC of L level.

Here, it is assumed that the semiconductor memory device 200 is such a semiconductor memory device that switching can be made between a word configuration [×16] and a word configuration [×8], or between a word configuration [×16] and a word configuration [×4]. The word configuration [×16] indicates that 16-bit data input and output are available by using 16 input/output terminals DQ0 to DQ15. In the same manner, the word configuration [×8] indicates that 8-bit data input and output are available by using 8 input/output terminals DQ0 to DQ7, and the word configuration [×4] indicates that 4-bit data input and output are available by using 4 input/output terminals DQ0 to DQ3.

When the switching is made from the word configuration [×16] to the word configuration [×8] or from the word configuration [×16] to the word configuration [×4], the relationships between the input/output terminals DQ0 to DQ15 in the word configuration [×16] and the input/output terminals DQ0 to DQ7 in the word configuration [×8] or the input/output terminals DQ0 to DQ3 in the word configuration [×4] are represented by the following Table 2.

TABLE 2

| Data Bus | Word configuration | | |
|---|---|---|---|
| | × 16 | × 18 | × 4 |
| DB0 | DQ0 | DQ0 | DQ0 |
| DB1 | DQ1 | | |
| DB2 | DQ2 | DQ1 | |
| DB3 | DQ3 | | |
| DB4 | DQ4 | DQ2 | DQ1 |
| DB5 | DQ5 | | |

TABLE 2-continued

| Data Bus | Word configuration | | |
|---|---|---|---|
| | × 16 | × 18 | × 4 |
| DB6 | DQ6 | DQ3 | |
| DB7 | DQ7 | | |
| DB8 | DQ8 | DQ4 | DQ2 |
| DB9 | DQ9 | | |
| DB10 | DQ10 | DQ5 | |
| DB11 | DQ11 | | |
| DB12 | DQ12 | DQ6 | DQ3 |
| DB13 | DQ13 | | |
| DB14 | DQ14 | DQ7 | |
| DB15 | DQ15 | | |

In the word configuration [×16], the data buses DB0 to DB15 for inputting and outputting data to the respective memory cells are set in one-to-one correspondence with the input/output terminals DQ0 to DQ15. When switching is made from the word configuration [×16] to the word configuration [×8], the input/output terminals DQ0 and DQ1 in the word configuration [×16] form the input/output terminal DQ0 in the word configuration [×8]. In the same manner, the input/output terminals DQ2 and DQ3 in the word configuration [×16] form the input/output terminal DQ1 in the word configuration [×8], and the input/output terminals DQ4 and DQ5 in the word configuration [×16] form the input/output terminal DQ2 in the word configuration [×8]. Moreover, the input/output terminals DQ6 and DQ7 in the word configuration [×16] form the input/output terminal DQ3 in the word configuration [×8], and the input/output terminals DQ8 and DQ9 in the word configuration [×16] form the input/output terminal DQ4 in the word configuration [×8]. Furthermore, the input/output terminals DQ10 and DQ11 in the word configuration [×16] form the input/output terminal DQ5 in the word configuration [×8], the input/output terminals DQ12 and DQ13 in the word configuration [×16] form the input/output terminal DQ6 in the word configuration [×8], and the input/output terminals DQ14 and DQ15 in the word configuration [×16] form the input/output terminal DQ7 in the word configuration [×8].

When switching is made from the word configuration [×16] to the word configuration [×4], the input/output terminals DQ0 to DQ3 in the word configuration [×16] form the input/output terminal DQ0 in the word configuration [×4], and the input/output terminals DQ4 to DQ7 in the word configuration [×16] form the input/output terminal DQ1 in the word configuration [×4]. In the same manner, the input/output terminals DQ8 to DQ11 in the word configuration [×16] form the input/output terminal DQ2 in the word configuration [×4], and the input/output terminals DQ12 to DQ15 in the word configuration [×16] form the input/output terminal DQ3 in the word configuration [×4].

Figure 12:
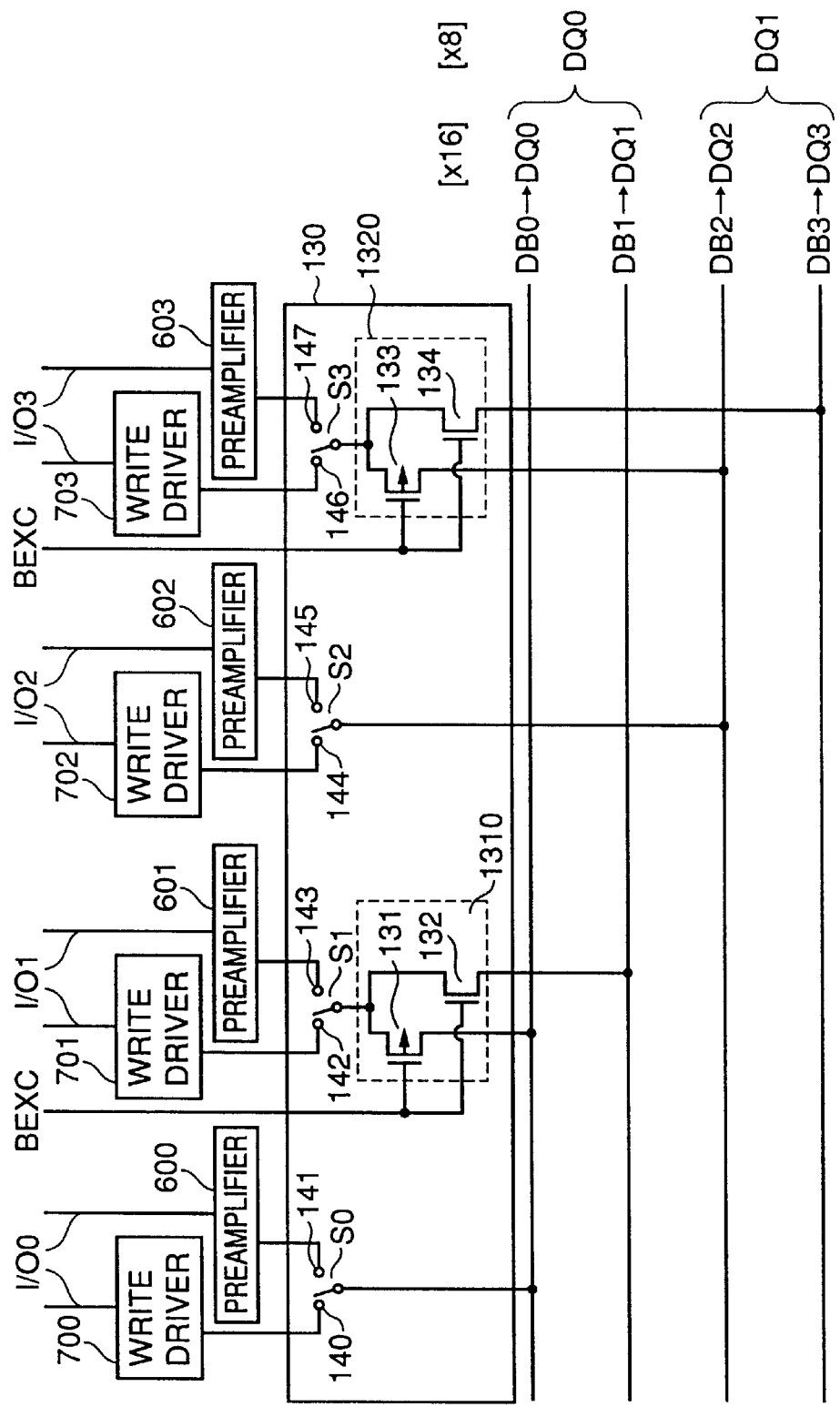
FIG. 12 is a plan view for explaining an operation of the word configuration switching circuit of the semiconductor memory device shown in FIG. 8.

Referring to FIG. 12, an explanation will be given of a mechanism for switching the word configuration [×16] to the word configuration [×8]. The word configuration switching circuit 130 includes switches S0 to S3 and data bus switching circuits 1310 and 1320. The switch S0 is connected to a write driver 700 through a terminal 140, and also connected to a preamplifier 600 through a terminal 141. The switch S1 is connected to a write deliver 701 through a terminal 142, and also connected to a preamplifier 601 through a terminal 143. The switch S2 is connected to a write diver 702 through a terminal 144, and also connected to a preamplifier 602 through a terminal 145. The switch S3 is connected to a write driver 703 through a terminal 146, and also connected to a preamplifier 603 through a terminal 147. Upon writing data in the memory cells, the switches S0 to S3 are respectively connected to the terminals 140, 142, 144 and 146 by control signals received from a control circuit (not shown). Moreover, upon reading data from the memory cells, the switches S0 to S3 are respectively connected to the terminals 141, 143, 145 and 147 by control signals received from the control circuit.

The data bus switching circuit 1310 is constituted by a P-channel MOS transistor 131 and an N-channel MOS transistor 132. The P-channel MOS transistor 131 is placed between the switch S1 and the data bus DB0, and the N-channel MOS transistor 132 is placed between the switch S1 and the data bus DB1. Moreover, the P-channel MOS transistor 131 and the N-channel MOS transistor 132 receive the word configuration switching signal BEXC of H level or L level from the word configuration switching signal generation circuit 120 at their gate terminals.

The data bus switching circuit 1320 is constituted by a P-channel MOS transistor 133 and an N-channel MOS transistor 134. The P-channel MOS transistor 133 is placed between the switch S3 and the data bus DB2, and the N-channel MOS transistor 134 is placed between the switch S3 and the data bus DB3. Moreover, the P-channel MOS transistor 133 and the N-channel MOS transistor 134 receive the word configuration switching signal BEXC of H level or L level from the word configuration switching signal generation circuit 120 at their gate terminals.

The switch S0 is connected to the data bus DB0, and the switch S2 is connected to the data bus DB2. The input/output lines I/O 0 to 3 are respectively connected to the preamplifiers 600 to 603 and the write drivers 700 to 703.

An explanation will be given of data input/output operations in the word configuration [×16]. In this case, the word configuration switching signal BEXC of H level is input to the data bus switching circuits 1310 and 1320 from the word configuration switching signal generation circuit 120. Then, in the data bus switching circuit 1310 the P-channel MOS transistor 131 is turned off and the N-channel MOS transistor 132 is turned on so that the switch S1 is connected to the data bus DB1. Moreover, in the data bus switching circuit 1320, the P-channel MOS transistor 133 is turned off and the N-channel MOS transistor 134 is turned on so that the switch S3 is connected to the data bus DB3.

Upon reading data from the memory cells, the switches S0 to S3 are respectively connected to terminals 141, 143, 145 and 147 by control signals received from the control circuit. The preamplifier 600 amplifies data on the input/output line I/O 0 and outputs the resulting data to the data bus DB0 through the switch S0. The data bus DB0 outputs the data to the input/output terminal DQ0 through the input/output interface circuit 10. The preamplifier 601 amplifies data on the input/output line I/O 1 and outputs the resulting data to the data bus DB1 through the switch S1 and the N-channel MOS transistor 132. The data bus DB1 outputs the data to the input/output terminal DQ1 through the input/output interface circuit 10. The preamplifier 602 amplifies data on the input/output line I/O 2 and outputs the resulting data to the data bus DB2 through the switch S2. The data bus DB2 outputs the data to the input/output terminal DQ2 through the input/output interface circuit 10. The preamplifier 603 amplifies data on the input/output line I/O 3 and outputs the resulting data to the data bus DB3 through the switch S3 and the N-channel MOS transistor 134. The data bus DB3 outputs the data to the input/output terminal DQ3 through the input/output interface circuit 10.

Upon writing data in the memory cells, the switches S0 to S3 are respectively connected to terminals 140, 142, 144 and 146 by control signals received from the control circuit. Data that has been input through the input/output terminal DQ0 is input to the data bus DB0 through the input/output interface circuit 10. Then, the data bus DB0 inputs the data to the write deliver 700 through the switch S0 so that the write driver 700 writes the data in the activated paired bit lines BL1, /BL1 to BLm, /BLm through the input/output line I/O 0 and the input/output I/O 80.

The data that has been input through the input/output terminal DQ1 is input to the data bus DB1 through the input/output interface circuit 10. Then, the data bus DB1 inputs the data to the write driver 701 through the N-channel MOS transistor 132 and the switch S1, and the write deliver 701 writes the data in the activated paired bit lines BL1, /BL1 to BLm, /BLm through the input/output line I/O 1 and the input/output 1/0 80.

The data that has been input through the input/output terminal DQ2 is input to the data bus DB2 through the input/output interface circuit 10. Then, the data bus DB2 inputs the data to the write driver 702 through the switch S2, and the write driver 702 writes the data in the activated paired bit lines BL1, /BL1 to BLm, /BLm through the input/output line I/O 2 and the input/output I/O 80.

The data that has been input through the input/output terminal DQ3 is input to the data bus DB3 through the input/output interface circuit 10. Then, the data bus DB3 inputs the data to the write driver 703 through the N-channel MOS transistor 134 and the switch S3, and the write driver 703 writes the data in the activated paired bit lines BL1, /BL1 to BLm, /BLm through the input/output line I/O 3 and the input/output I/O 80.

Thus, the data write and data read operations in and from the memory cells in the word configuration [×16] are completed.

An explanation will be given of data input/output operations in the word configuration [×8]. In this case, the word configuration switching signal BEXC of L level is input to the data bus switching circuits 1310 and 1320 from the word configuration switching signal generation circuit 120. Then, in the data bus switching circuit 1310, the P-channel MOS transistor 131 is turned on and the N-channel MOS transistor 132 is turned off so that the switch S1 is connected to the data bus DB0. Moreover, in the data bus switching circuit 1320, the P-channel MOS transistor 133 is turned on and the N-channel MOS transistor 134 is turned off so that the switch S3 is connected to the data bus DB2.

Upon reading data from the memory cells, the switches S0 to S3 are respectively connected to terminals 141, 143, 145 and 147 by control signals received from the control circuit. The preamplifier 600 amplifies data on the input/output line I/O 0 and outputs the resulting data to the data bus DB0 through the switch S0. The data bus DB0 outputs the data to the input/output terminal DQ0 through the input/output interface circuit 10. The preamplifier 601 amplifies data on the input/output line I/O 1 and outputs the resulting data to the data bus DB0 through the switch S1 and the P-channel MOS transistor 131. The data bus DB0 outputs the data to the input/output terminal DQ0 through the input/output interface circuit 10. The preamplifier 602 amplifies data on the input/output line I/O 2 and outputs the resulting data to the data bus DB2 through the switch S2. The data bus DB2 outputs the data to the input/output terminal DQ1 through the input/output interface circuit 10. The preamplifier 603 amplifies data on the input/output line I/O 3 and outputs the resulting data to the data bus DB2 through the switch S3 and the P-channel MOS transistor 133. The data bus DB2 outputs the data to the input/output terminal DQ1 through the input/output interface circuit 10.

Upon writing data in the memory cells, the switches S0 to S3 are respectively connected to terminals 140, 142, 144 and 146 by control signals received from the control circuit. Data that has been input through the input/output terminal DQ0 is input to the data bus DB0 through the input/output interface circuit 10. Then, the data bus DB0 inputs the data to the write driver 700 through the switch S0 or to the write driver 701 through the P-channel MOS transistor 131 and the switch S1. The write deliver 700 writes the data in the activated paired bit lines BL1, /BL1 to BLm, /BLm through the input/output line I/O 0 and the input/output I/O 80. The write driver 701 writes the data in the activated paired bit lines BL1, /BL I to BLm, /BLm through the input/output line I/O 1 and the input/output I/O 80.

Data that has been input through the input/output terminal DQ1 is input to the data bus DB2 through the input/output interface circuit 10. Then, the data bus DB2 inputs the data to the write deliver 702 through the switch S2 or to the write driver 703 through the P-channel MOS transistor 133 and the switch S3. The write driver 702 writes the data in the activated paired bit lines BL1, /BL1 to BLm, /BLm through the input/output line I/O 2 and the input/output I/O 80. The write deliver 703 writes the data in the activated paired bit lines BL1, /BL1 to BLm, /BLm through the input/output line I/O 3 and the input/output I/O 80.

FIG. 12 shows the mechanism for switching the input/output terminals DQ0 to DQ3 in the word configuration [×16] to the input/output terminals DQ0 and DQ1 in the word configuration [×8]. In the same manner as the mechanism shown in FIG. 12, the input/output terminals DQ4 to DQ7, DQ8 to DQ11 and DQ12 to DQ15 in the word configuration [×16] are also switched to the input/output terminals DQ2 and DQ3, DQ4 and DQ5, and DQ6 and DQ7 in the word configuration [×8], respectively. Therefore, the word configuration switching circuit 130 is further includes 12 switches and 6 data bus switching circuits having the same construction as that of the data bus switching circuits 1310 and 1320. Thus, the data write and data read operations in and from the respective memory cells are carried out in the word configuration [×16] as well as in the word configuration [×8] by using the 12 switches and 6 data bus switching circuits.

Figure 13:
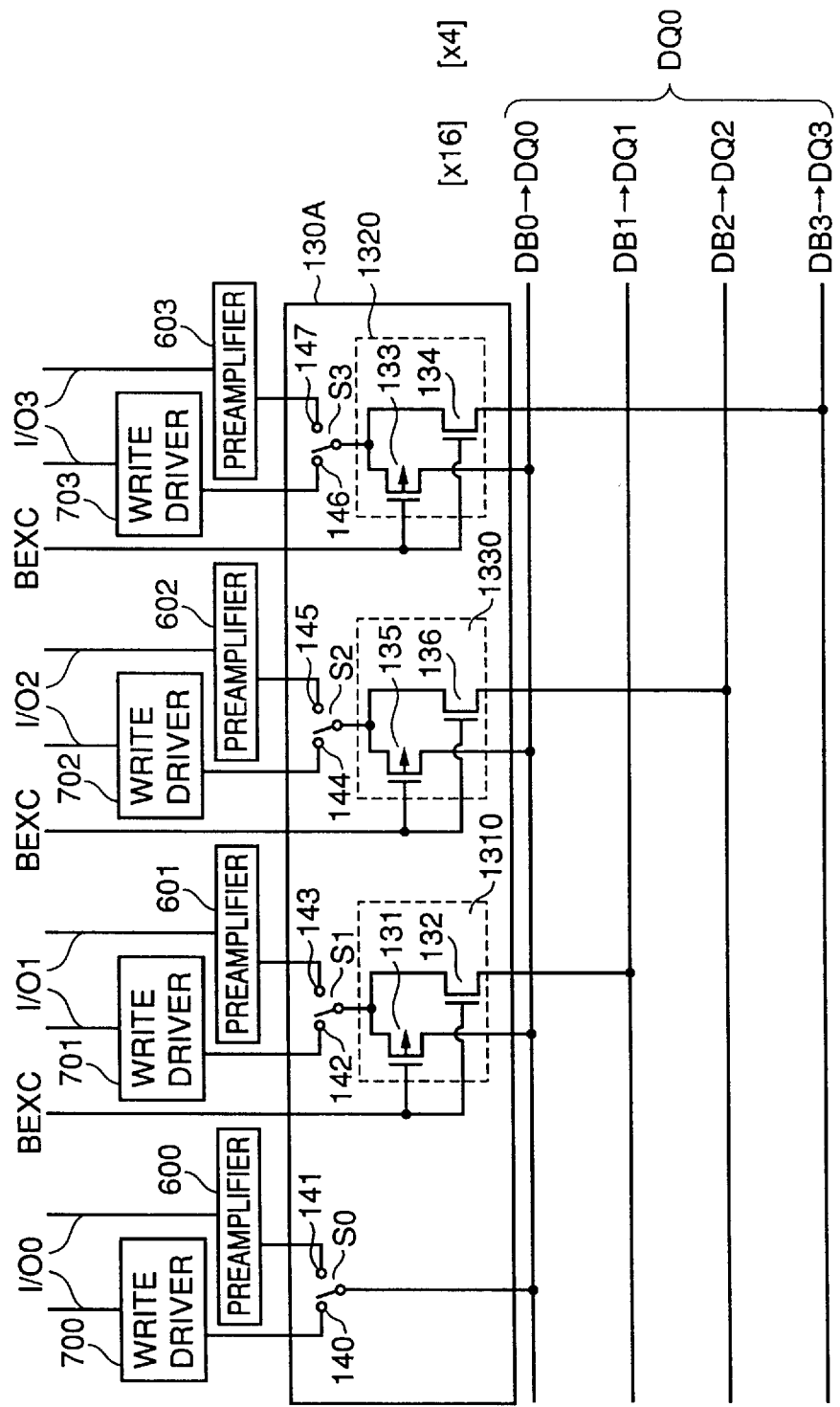
FIG. 13 is a plan view for explaining another operation of the word configuration switching circuit of the semiconductor memory device shown in FIG. 8.

Referring to FIG. 13, an explanation will be given of a mechanism for switching the word configuration [×16] to the word configuration [×4]. In this case, a word configuration switching circuit 130A is used in place of the word configuration switching circuit 130. The word configuration switching circuit 130A is formed by adding the data bus switching circuit 1330 to the word configuration switching circuit 130. The data bus switching circuit 1330 is constituted by a P-channel MOS transistor 135 and an N-channel MOS transistor 136. The P-channel MOS transistor 135 is placed between the switch S2 and the data bus DB0, and the N-channel MOS transistor 136 is placed between the switch S2 and the data bus DB2. Moreover, the P-channel MOS transistor 135 and the N-channel MOS transistor 136 receive the word configuration switching signal BEXC from the word configuration switching signal generation circuit 120 at their gate terminals. In this case, the P-channel MOS transistor 133 of the data bus switching circuit 1320 is placed between the switch S3 and the data bus DB0. The other structures are the same as those of the word configuration switching circuit 130.

An explanation will be given of data input/output operations in the word configuration [×16]. In this case, the word configuration switching signal BEXC of H level is input to the data bus switching circuits 1310, 1320 and 1330 from the word configuration switching signal generation circuit 120. Then, in the data bus switching circuit 1310, the P-channel MOS transistor 131 is turned off and the N-channel MOS transistor 132 is turned on so that the switch S1 is connected to the data bus DB1. Moreover, in the data bus switching circuit 1320, the P-channel MOS transistor 133 is turned off and the N-channel MOS transistor 134 is turned on so that the switch S3 is connected to the data bus DB3. Furthermore, in the data bus switching circuit 1330, the P-channel MOS transistor 135 is turned off and the N-channel MOS transistor 136 is turned on so that the switch S2 is connected to the data bus DB2.

Upon reading data from the memory cells, the switches S0 to S3 are respectively connected to terminals 141, 143, 145 and 147 by control signals received from the control circuit. The preamplifier 600 amplifies data on the input/output line I/O 0 and outputs the resulting data to the data bus DB0 through the switch S0. The data bus DB0 outputs the data to the input/output terminal DQ0 through the input/output interface circuit 10. The preamplifier 601 amplifies data on the input/output line I/O 1 and outputs the resulting data to the data bus DB1 through the switch S1 and the N-channel MOS transistor 132. The data bus DB1 outputs the data to the input/output terminal DQ1 through the input/output interface circuit 10. The preamplifier 602 amplifies data on the input/output line I/O 2 and outputs the resulting data to the data bus DB2 through the switch S2 and the N-channel MOS transistor 136. The data bus DB2 outputs the data to the input/output terminal DQ2 through the input/output interface circuit 10. The preamplifier 603 amplifies data on the input/output line I/O 3 and outputs the resulting data to the data bus DB3 through the switch S3 and the N-channel MOS transistor 134. The data bus DB3 outputs the data to the input/output terminal DQ3 through the input/output interface circuit 10.

Upon writing data in the memory cells, the switches S0 to S3 are respectively connected to terminals 140, 142, 144 and 146 by control signals received from the control circuit. Data that has been input through the input/output terminal DQ0 is input to the data bus DB0 through the input/output interface circuit 10. Then, the data bus DB0 inputs the data to the write driver 700 through the switch S0 so that the write driver 700 writes the data in the activated paired bit lines BL1, /BL1 to BLm, /BLm through the input/output line I/O 0 and the input/output I/O 80.

The data that has been input through the input/output terminal DQ1 is input to the data bus DB1 through the input/output interface circuit 10. Then, the data bus DB1 inputs the data to the write driver 701 through the N-channel MOS transistor 132 and the switch S1, and the write driver 701 writes the data in the activated paired bit lines BL1, /BL1 to BLm, /BLm through the input/output line I/O 1 and the input/output I/O 80.

The data that has been input through the input/output terminal DQ2 is input to the data bus DB2 through the input/output interface circuit 10. Then, the data bus DB2 inputs the data to the write driver 702 through the N-channel MOS transistor 136 and the switch S2, and the write driver 702 writes the data in the activated paired bit lines BL1, /BL1 to BLm, /BLm through the input/output line I/O 2 and the input/output I/O 80.

The data that has been input through the input/output terminal DQ3 is input to the data bus DB3 through the input/output interface circuit 10. Then, the data bus DB3 inputs the data to the write driver 703 through the N-channel MOS transistor 134 and the switch S3, and the write driver 703 writes the data in the activated paired bit lines BL1, /BL1 to BLm, IBLm through the input/output line I/O 3 and the input/output I/O 80.

Thus, the data write and data read operations in and from the memory cells in the word configuration [×16] are completed.

An explanation will be given of data input/output operations in the word configuration [×4]. In this case, the word configuration switching signal BEXC of L level is input to the data bus switching circuits 1310, 1320 and 1330 from the word configuration switching signal generation circuit 120. Then, in the data bus switching circuit 1310, the P-channel MOS transistor 131 is turned on and the N-channel MOS transistor 132 is turned off so that the switch S1 is connected to the data bus DB0. Moreover, in the data bus switching circuit 1320, the P-channel MOS transistor 133 is turned on and the N-channel MOS transistor 134 is turned off so that the switch S3 is connected to the data bus DB0. Furthermore, in the data switching circuit 1330, the P-channel MOS transistor 135 is turned on and the N-channel MOS transistor 136 is turned off so that the switch S2 is connected to the data bus DB0.

Upon reading data from the memory cells, the switches S0 to S3 are respectively connected to terminals 141, 143, 145 and 147 by control signals received from the control circuit. The preamplifier 600 amplifies data on the input/output line I/O 0 and outputs the resulting data to the data bus DB0 through the switch S0. The data bus DB0 outputs the data to the input/output terminal DQ0 through the input/output interface circuit 10. The preamplifier 601 amplifies data on the input/output line I/O 1 and outputs the resulting data to the data bus DB0 through the switch S1 and the P-channel MOS transistor 131. The data bus DB0 outputs the data to the input/output terminal DQ0 through the input/output interface circuit 10. The preamplifier 602 amplifies data on the input/output line I/O 2 and outputs the resulting data to the data bus DB0 through the switch S2 and the P-channel MOS transistor 135. The data bus DB0 outputs the data to the input/output terminal DQ0 through the input/output interface circuit 10. The preamplifier 603 amplifies data on the input/output line I/O 3 and outputs the resulting data to the data bus DB0 through the switch S3 and the P-channel MOS transistor 133. The data bus DB0 outputs the data to the input/output terminal DQ0 through the input/output interface circuit 10.

Upon writing data in the memory cells, the switches S0 to S3 are respectively connected to terminals 140, 142, 144 and 146 by control signals received from the control circuit. Data that has been input through the input/output terminal DQ0 is input to the data bus DB0 through the input/output interface circuit 10. Then, the data bus DB0 inputs the data to the write driver 700 through the switch S0 or to the write driver 701 through the P-channel MOS transistor 131 and the switch S1 or to the write driver 702 through the P-channel MOS transistor 135 and the switch S2 or to the write deliver 703 through the P-channel MOS transistor 133 and the switch S3. The write driver 700 writes the data in the activated paired bit lines BL1, /BL1 to BLm, /BLm through the input/output line I/O 0 and the input/output I/O 80. The write driver 701 writes the data in the activated paired bit lines BL1, /BL1 to BLm, /BLm through the input/output line I/O 1 and the input/output I/O 80. The write driver 702 writes the data in the activated paired bit lines BL1, /BL1 to BLm, /BLm through the input/output line I/O 2 and the input/output I/O 80. The write driver 703 writes the data in the activated paired bit lines BL1, /BL1 to BLm, /BLm through the input/output line I/O 3 and the input/output I/O 80.

FIG. 13 shows the mechanism for switching the input/output terminals DQ0 to DQ3 in the word configuration [×16] to the input/output terminals DQ0 in the word configuration [×4]. In the same manner as the mechanism shown in FIG. 13, the input/output terminals DQ4 to DQ7, DQ8 to DQ11 and DQ12 to DQ15 in the word configuration [×16] are also switched to the input/output terminals DQ1, DQ2 and DQ3 in the word configuration [×8], respectively. Therefore, the word configuration switching circuit 130A further includes 12 switches and 9 data bus switching circuits having the same construction as that of the data bus switching circuits 1310, 1320 and 1330. Thus, the data write and data read operations in and from the respective memory cells are carried out in the word configuration [×16] as well as in the word configuration [×4] by using the 12 switches and 9 data bus switching circuits.

Referring to FIG. 12 and FIG. 13, an explanation has been given of the switching between the word configuration [×16] and the word configuration [×8] as well as the switching between the word configuration [×16] and the word configuration [×4]; and in the same manner, switching may be made between the word configuration [×8] and the word configuration [×4].

Referring to FIG. 8 again, when a testing operation is carried out on the semiconductor memory device 200, the test device outputs a fixing command KCB and an address signal A0 to An−1 to the semiconductor memory device 200. In this case, the test device outputs a command KCB1 for specifying a shift to a word configuration switching mode and a command KCB2 consisting of a pattern [11101101] for specifying a switchover from the word configuration [×16] to the word configuration [×8] to the semiconductor memory device 200.

The input/output interface circuit 10 outputs the received address signals A0 to An−1 to the row decoder 30 and the column decoder 70, and also outputs the fixing command KCB consisting of the commands KCB1 and KCB2 to the word configuration switching signal generation circuit 120.

The row decoder 30 decodes the address signals A0 to An−1, and outputs the decoded row addresses to the word line driver 40. The word line driver 40 activates the word lines W1 to Wn corresponding to the input row addresses. The column decoder 70 decodes the address signals A0 to An−1, and outputs the decoded column addresses to the input/output I/O 80. The input/output I/O 80 connects paired bit lines BL1, /BL1 to BLm, /BLm corresponding to the received column addresses to the input/output line I/O.

The word configuration switching signal generation circuit 120 generates the word configuration switching signal BEXC of L level by using the above-mentioned method, and outputs the word configuration switching signal BEXC to the word configuration switching circuit 130. The word configuration switching circuit 130 switches the word configuration in the semiconductor memory device 200 from the word configuration [×16] to the word configuration [×8] by using the above-mentioned method.

The test device outputs write data for use in the test to the semiconductor memory device 200. The input/output interface circuit 10 inputs the write data to the write driver 70A through the data buses DB0 to DB7 and the word configuration switching circuit 130. The write deliver 70A outputs the write data to the paired bit lines BL1, /BL1 to BLm, /BLm connected to the input/output line I/O through the input/output line I/O. Then, the data is written in the respective memory cells by the activated word lines W1 to Wn and the paired bit lines BL1, /BL1 to BLm, /BLm in the word configuration [×8].

Upon completion of the data writing operation in the memory cells, a data reading operation is carried out from the respective memory cells. The address signal A0 to An−1 are input to the semiconductor memory device 200 and the word lines W1 to Wn corresponding to the row addresses and the paired bit lines BL1, /BL1 to BLm, /BLm corresponding to the column addresses are selected. Thus, up to this process, the same processes as those of the data writing operation are carried out.

The sense amplifier 90 amplifies read data read out from the respective memory cells by the activated word lines W1 to Wn and paired bit lines BL1, /BL1 to BLm, /BLm, and outputs the amplified data to the input/output line I/O connected thereto by the input/output I/O 80. The preamplifier 60 further amplifies the read data on the input/output line I/O, and outputs the amplified read data to the data buses DB0 to DB7 by the above-mentioned method. Then, the input/output interface circuit 10 outputs the read data from the data buses DB0 to DB7 to the input/output terminals DQ0 to DQ7. The test device compares the read data output from the input/output terminals DQ0 to DQ7 with the write data, thereby carrying out the test on the respective memory cells.

Thus, the testing operation in the word configuration [×8] is completed. By switching the word configuration from [×16] to [×8], the number of the input/output terminals to be connected to the test device is reduced to half, that is, from 16 pins to 8 pins. Thus, it is possible to carry out more tests on semiconductor memory devices at the same time. Even upon carrying out tests in the word configuration [×8], when the number of semiconductor memory devices that can be tested at the same time is small, the semiconductor memory devices 200 can be tested by switching the word configuration from [×16] to [×4]. Consequently, it becomes possible to carry out the test on further more semiconductor memory devices at the same time.

Here, even when the test is carried out on the semiconductor memory device 200 by switching from the word configuration [×16] to the word configuration [×8] or to the word configuration [×4], since data write and data read operations can be carried out on all the memory cells as described above, there is no degradation in the quality of the test.

As described above, in a test mode, the test can be carried out by switching the word configuration of the semiconductor memory device 200 to that fewer than the normally used. However, not limited to this arrangement, the semiconductor memory device 200 may be used by switching the word configuration from [×16] to [×8] or to [×4] in a normal operation. In this case, byte pins for switching word configurations need not to be attached to the semiconductor memory device 200 in a separated manner, therefore, it is possible to provide a semiconductor memory device in which word configurations can be changed with fewer pins.

Here, in the semiconductor memory device 200, the preamplifier 60, the write driver 70A, the input/output I/O 80, the sense amplifier 90 and the word configuration switching circuit 130 constitute an input/output circuit 150.

In accordance with the second embodiment, the test is carried out by using the word configuration fewer than the normally used, of the semiconductor memory device, therefore, even when the number of test pins of the test device is smaller than the number of the data pins of the semiconductor memory device, it is possible to carry out the test on the semiconductor memory device without degradation in the quality of the test.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    n (natural number) number of input/output terminals for inputting n number of address signals;
    a command terminal for inputting a fixing command to fix the address signals to a first or second logic;
    a plurality of memory cells;
    a plurality of bit lines corresponding to said plurality of memory cells;
    a plurality of word lines corresponding to said plurality of memory cells;
    an inner circuit inputting m number of address signals through m (m: a natural number satisfying n−m>1) number of input/output terminals among said n number of input/output terminals upon entering a test mode, generating n−m number of first logical signals fixing each of n−m number of address signals to a first logic or n−m number of second logical signals fixing each of said n−m number of address signals to a second logic based upon said fixing command and outputting n number of inner address signals including said m number of address signals and said n−m number of first or second logical signals; and
    a row/column decoder decoding address signals for activating said plurality of bit lines or said plurality of word lines based upon said n number of inner address signals.

2. The semiconductor memory device according to claim 1, wherein said inner circuit generates, based upon said fixing command, said n−m number of the first or second logical signals with respect to n−m number of high order address signals among said n number of address signals.

3. The semiconductor memory device according to claim 1, wherein said inner circuit comprises:
    an interface circuit generating n−m number of pairs of third and fourth logical signals based upon said fixing command; and
    n−m number of logical circuits receiving a pair of the third and fourth logical signals, generating said first logic signal when said third logical signal has the first logic and said fourth logical signal has the second logic, and generating said second logical signal when said third logical signal has the second logic and said fourth logical signal has the first logic.

4. The semiconductor memory device according to claim 3, wherein each of said n−m number of logical circuits includes a pad for inputting one of said n−m number of address signals, and outputs the one of said address signals as it is when said third and fourth logical signal have the second logic and the one of said address signals is input through said pad.

5. A semiconductor memory device, which is operated by a first word configuration or a second word configuration different from said first word configuration, comprising:

an input/output terminal for inputting a fixing command;

a plurality of memory cells;

a word configuration switching signal generation circuit generating a fast word configuration switching signal for switching the word configuration thereof to said first word configuration and a second word configuration switching signal for switching the word configuration thereof to said second word configuration based upon said fixing command; and an input/output circuit switching the word configuration to said first or second word configuration, and inputting and outputting data to and from said memory cells based upon said first or second word configuration switching signal.

6. The semiconductor memory device according to claim 5, wherein said word configuration switching signal generation circuit further comprises:

an interface circuit for generating the first and second logical signals based upon said fixing command; and a logical circuit generating said first word configuration switching signal when said first logical signal has the first logic and said second logical signal has the second logic, and generating said second word configuration switching signal when said first logical signal has the second logic and said second logical signal has the first logic.

7. A semiconductor memory device comprising:

n input/output terminals receiving n address signals, n being a natural number;

a command terminal receiving a fixing command fixing the address signals at one of a first logic and a second logic;

a plurality of memory cell;

a plurality of bit lines corresponding to said plurality of memory cells;

a plurality of word lines corresponding to said plurality of memory cells;

an internal circuit receiving m address signals through m said input/output terminals and driven by said fixing command to fix (n−m) address signals each at the first logic to provide (n−m) first logic signals or to fix (n−m) address signals each at the second logic to provide (n−m) second logic signals so as to output n internal address signals formed of said m address signals and said (n−m) first or second logic signals, m being a natural number satisfying that n minus m is no smaller than one; and a row/column decoder operative in response to said n internal address signals to decode address signals activating each of said plurality of bit lines or each of said plurality of bit lines or each of said plurality of word lines.

8. A semiconductor memory device comprising:

a plurality of memory cells;

an address input terminal receiving an external address signal provided external to the semiconductor memory device;

a command terminal receiving first and second fixing commands; and an internal circuit including a set circuit driven by said first fixing command to set one of an internal address signal for selecting said memory cell, and a fix circuit driven by said second fixing command to fix said internal address signal at one of a first logic and a second logic.

9. The semiconductor memory device according to claim 8, wherein said address signal constitutes a portion of said address signal required for selecting said memory cell.

10. The semiconductor memory device according to claim 8, wherein said set circuit and said fix circuit receive said first and second fixing commands, and output a signal setting said address signal to correspond to one of an external address signal and a internal address signal, and a signal fixing said internal address signal at one of said first logic and said second logic.

11. A semiconductor memory device having a plurality of memory cells and operative to write and read data to and from said plurality of memory cells in a first word configuration a second word configuration distinguished from said first word configuration, comprising;

a command terminal receiving first and second fixing command;

a word configuration switch signal generation circuit driven by said first fixing command to output a shift signal indicative of shifting to a word configuration switch mode, and driven by said second fixing command to output an indication signal indicating which one of said first and second word configurations is designated as a word configuration of said word configuration switch mode; and a word configuration switch circuit switching a word configuration in response to said shift signal and said indication signal.

* * * * *